United States Patent
Kono et al.

(10) Patent No.: US 6,515,521 B2
(45) Date of Patent: Feb. 4, 2003

(54) SEMICONDUCTOR INTEGRATED CIRCUIT FOR LOW POWER AND HIGH SPEED OPERATION

(75) Inventors: Ichiro Kono, Mitaka (JP); Kazuo Yano, Hino (JP); Naoki Kato, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/927,936

(22) Filed: Aug. 13, 2001

(65) Prior Publication Data

US 2002/0030510 A1 Mar. 14, 2002

Related U.S. Application Data

(62) Division of application No. 09/436,501, filed on Nov. 9, 1999, now Pat. No. 6,297,674.

(30) Foreign Application Priority Data

Nov. 10, 1998 (JP) .......................................... 10-318692

(51) Int. Cl.[7] .............................. H03B 1/00; H03K 3/00
(52) U.S. Cl. ........................ 327/108; 327/112; 326/80
(58) Field of Search ................................ 327/108, 112; 326/82, 83, 86

(56) References Cited

U.S. PATENT DOCUMENTS

| | | | | |
|---|---|---|---|---|
| 4,983,861 A | * | 1/1991 | Kikuchi et al. ................ 326/14 |
| 5,218,247 A | * | 6/1993 | Ito et al. ....................... 326/27 |
| 5,331,228 A | * | 7/1994 | Brady .......................... 326/122 |
| 5,440,258 A | * | 8/1995 | Galbi et al. ................... 327/112 |
| 5,585,740 A | * | 12/1996 | Tipon .......................... 326/121 |
| 5,751,160 A | * | 5/1998 | Baek et al. .................... 326/27 |
| 5,801,563 A | | 9/1998 | McClure ...................... 327/170 |
| 5,894,238 A | | 4/1999 | Chien .......................... 327/112 |
| 5,917,348 A | | 6/1999 | Chow .......................... 327/108 |
| 6,066,975 A | * | 5/2000 | Matano ........................ 326/62 |
| 6,114,898 A | * | 9/2000 | Okayasu ....................... 326/30 |
| 6,304,120 B1 | * | 10/2001 | Taito ........................... 327/112 |

FOREIGN PATENT DOCUMENTS

JP 7-162288 6/1995

OTHER PUBLICATIONS

Sakata et al, 1993 Symposium on VLSI Circuits Digest of Technical Papers, pp. 45–46.
Kuroda et al, IEEE International Solid–State Circuits Conference Digest of Technical Papers, 1996, pp. 166–167.
IEEE Journal of Solid–State Circuits, vol. 30, No. 8, Aug. 1995, Mutoh er al, pp. 847–853.

* cited by examiner

Primary Examiner—Terry D. Cunningham
Assistant Examiner—Quan Tra
(74) Attorney, Agent, or Firm—Mattingly, Stanger & Malur, P.C.

(57) ABSTRACT

A semiconductor integrated circuit includes: a first p-channel FET having a gate controlled by a first input and having a source-drain path connected between a first operating potential point and a first node; a first n-channel FET having a gate controlled by a second input and having a source-drain path connected between the first node and a second node; a second n-channel FET having a gate controlled by the first node and having a source-drain path connected between the second node and a second operating potential point; a third n-channel FET having a gate controlled by the first node and having a source-drain path connected between the second node and a third operating potential point; a second p-channel FET having a gate controlled by the first input and having a source-drain path connected between a third node and a fourth node; a third p-channel FET having a gate controlled by the fourth node and having a source-drain path connected between the first operating potential point and the third node; a fourth p-channel FET having a gate controlled by the fourth node and having a source-drain path connected between a fourth operating potential point and the third node; and a fourth n-channel FET having a gate controlled by the second input and having a source-drain path connected between the fourth node and the second operating potential point.

7 Claims, 21 Drawing Sheets

SEMICONDUCTOR INTEGRATED CIRCUIT FOR LOW POWER AND HIGH SPEED OPERATION

This is a divisional application of U.S. Ser. No. 09/436,501, filed Nov. 9, 1999 now U.S. Pat. No. 6,297,674.

BACKGROUND OF THE INVENTION

The present invention relates to a semiconductor integrated circuit and particularly to a semiconductor integrated circuit using MOS transistors.

In recent years, high integration and low power consumption have been promoted in various kinds of semiconductor integrated circuits. In a semiconductor integrated circuit, there is a threshold voltage Vt for determining the on-off characteristic of an MOS transistor. The threshold voltage Vt must be lowered to improve drivability to thereby improve the operating speed of the circuit. Even in the case where the internal supply voltage Vdd of the circuit is lowered, the threshold voltage Vt needs to be set to be small in order to keep the operating speed high.

Lowering of the threshold voltage Vt, however, incurs a problem that the power consumption of the semiconductor integrated circuit increases greatly due to rapid increase of leakage current as described in 1993 Symposium on VLSI Circuits Digest of Technical Papers, pp. 45–46.

To prevent this problem, there is proposed a semiconductor integrated circuit in which the substrate bias voltage is changed according to the operating mode, such as a stand-by mode, an active mode, or the like, to thereby control the threshold voltage of an MOS transistor, in IEEE International Solid-State Circuits Conference Digest of Technical Papers, pp. 166–167, 1996.

On the other hand, there is a further proposal in which real and virtual power supply lines are provided so as to be linked by switching MOS transistors so that main circuits are supplied with power through the virtual power supply lines but the switching MOS transistors are turned off in the stand-by mode to prevent the main circuits from being supplied with power to thereby achieve reduction of power consumption, in IEEE Journal of Solid-State Circuits, Vol. 30, No. 8, August 1995. Increase of the leakage current is, however, unavoidable for high-speed operation in the active mode even in the case where these background-art techniques are used.

FIGS. 24A and 24B show three stages of inverters as an example of background-art circuit. FIG. 24A shows an equivalent circuit configuration. FIG. 24B shows a specific circuit configuration. When, for example, node O1 is at an "L" level in the stand-by mode, node O3 is at an "L" level and nodes O2 and O4 are at an "H" level. In this case, with respect to the first and second stages of inverters, a leakage current flows through transistors Q1 and Q4. If the threshold voltage of the transistors is lowered, the leakage current increases greatly.

On the other hand, in accordance with JP-A-7-162288, there is a proposal in which time difference is provided between a signal supplied to an MOS transistor changed from OFF to ON and a signal supplied to an MOS transistor changed from ON to OFF so that the former signal is propagated earlier than the latter signal to thereby achieve high-speed operation without providing any change of the threshold voltage Vt. If the former signal is propagated earlier, it is, however, impossible to expect a greatly speeding-up effect as a whole because the latter signal is propagated later. The inventors' examination has proved that the speeding-up effect is about 10% at the best.

In each of the background-art semiconductor integrated circuits, as described above, there was a problem that the leakage current in the active mode increased when the operating speed of the circuit was improved or kept high even when the internal supply voltage Vdd was lowered.

SUMMARY OF THE INVENTION

The present invention is configured in consideration of the aforementioned circumstances and it is an object thereof to provide a semiconductor integrated circuit in which not only power consumption caused by a leakage current in an active mode can be suppressed from increasing but also the circuit can operate at a high speed.

In order to achieve the above object, according to an aspect of the present invention, there is provided a semiconductor integrated circuit comprising: a first p-channel FET having a gate controlled by a first input and having a source-drain path connected between a first operating potential point and a first node; a first n-channel FET having a gate controlled by a second input and having a source-drain path connected between the first node and a second node; a second n-channel FET having a gate controlled by the first node and having a source-drain path connected between the second node and a second operating potential point; a third n-channel FET having a gate controlled by the first node and having a source-drain path connected between the second node and a third operating potential point; a second p-channel FET having a gate controlled by the first input and having a source-drain path connected between a third node and a fourth node; a third p-channel FET having a gate controlled by the fourth node and having a source-drain path connected between the first operating potential point and the third node; a fourth p-channel FET having a gate controlled by the fourth node and having a source-drain path connected between a fourth operating potential point and the third node; and a fourth n-channel FET having a gate controlled by the second input and having a source-drain path connected between the fourth node and the second operating potential point.

According to another aspect of the present invention, there is provided a semiconductor integrated circuit comprising: a first p-channel FET having a gate controlled by a first input and having a source-drain path connected between a first operating potential point and a first node; a first n-channel FET having a gate controlled by a second input and having a source-drain path connected between the first node and a second operating potential point; a second n-channel FET having a gate controlled by the first operating potential point and having a source-drain path connected between the first node and the second operating potential point; a second p-channel FET having a gate controlled by the first node and having a source-drain path connected between the first operating potential point and the second node; a third n-channel FET having a gate controlled by the second input and having a source-drain path connected between the second node and the second operating potential point; and a third p-channel FET having a gate controlled by the second operating potential point and having a source-drain path connected between the first operating potential point and the second node.

According to a further aspect of the present invention, in view of the operation of an input signal, there is provided a semiconductor integrated circuit comprising a PMOS transistor (or a p-channel FET) and an NMOS transistor (an n-channel FET), wherein: a first signal is supplied to a gate of the PMOS transistor; a second signal is supplied to a gate of the NMOS transistor; and the first signal and the second signal are different from each other and satisfy the relations $$PS \leq NS < PL \leq NL$$

in which PL is the largest level of the first signal, PS is the smallest level of the first signal, NL is the largest level of the second signal, and NS is the smallest level of the second signal.

According to a further aspect of the present invention, there is provided a semiconductor integrated circuit comprising a PMOS transistor, and an NMOS transistor, wherein: a first signal is supplied to a gate of the PMOS transistor; a second signal is supplied to a gate of the NMOS transistor; and the first signal and the second signal are different from each other and levels PS, NS, NG, PG, PL and NL are arranged in order when the first signal changes between PL and PS, the second signal changes between NL and NS, PG is a gate input level serving as a threshold for turning on/off the PMOS transistor, and NG is a gate input level serving as a threshold for turning on/off the NMOS transistor.

Here, preferably, the difference between NG and NL is larger than the difference between NG and NS. Further, preferably, the difference between PG and PS is larger than the difference between PG and PL.

Specifically, the first signal has a rectangular waveform which changes between PL and PS; the second signal has a rectangular waveform (for example, pulse signal) which changes between NL and NS; and preferably, in view of easiness of control, the first signal is synchronized with the second signal both in leading edge timing and in trailing edge timing. That is, in-phase but different-waveform pulse signals are given to the gates of the PMOS and NMOS transistors respectively to control the PMOS and NMOS transistors. Specifically, the high and low levels of the PMOS transistor are different from those of the NMOS transistor. More specifically, the PMOS transistor is turned on at a trailing edge of the first signal; and the NMOS transistor is turned on at a leading edge of the second signal. In the present invention, there is no particular necessity to provide a time difference (phase difference) between the first and second signals.

The above configurations may be arranged into a suitable configuration such that a semiconductor integrated circuit comprises a PMOS transistor, and an NMOS transistor, wherein: a first pulse signal is supplied to a gate of the PMOS transistor; a second pulse signal is supplied to a gate of the NMOS transistor; HIGH of the first pulse signal is different from HIGH of the second pulse signal; LOW of the first pulse signal is different from LOW of the second-pulse signal; timing of changing the first pulse signal from HIGH to LOW is synchronized with timing of changing the second pulse signal from HIGH to LOW; and timing of changing the first pulse signal from LOW to HIGH is synchronized with timing of changing the second pulse signal from LOW to HIGH.

Further, specifically, the semiconductor integrated circuit further comprises a first circuit for generating the first pulse signal, and a second circuit for generating the second pulse signal, wherein: the first circuit includes PMOS and NMOS transistors having source-drain paths connected in series; and the second circuit includes PMOS and NMOS transistors having source-drain paths connected in series.

Further, specifically, the series connected source-drain paths of the PMOS and NMOS transistors of the first circuit are connected between a first potential and a first node; the series connected source-drain paths of the PMOS and NMOS transistors of the second circuit are connected between a second potential and a second node; either one of the second potential and a third potential is supplied to the first node through a first selector; and either one of the first potential or a fourth potential is supplied to the second node through a second selector.

A circuit layout suitable for achieving these circuits is as follows. Arranging a first wiring for feeding a first electric potential, a second wiring for feeding a second electric potential, a third wiring for feeding a third electric potential and a fourth wiring for feeding a fourth electric potential in parallel with one another is desirable for a compact circuit configuration. These wirings may be arranged in one metal wiring layer. If the increase of the area for these wirings is disliked, these wirings may be formed in different metal wiring layers and the metal wiring layers may be laminated vertically.

Further, the present invention may be used in combination with a technique of controlling the substrate bias voltage of transistors to change the threshold voltage of the transistors to thereby reduce the subthreshold leakage current. For this reason, there are required a fifth wiring for supplying the substrate bias potential of the PMOS transistor and a sixth wiring for supplying the substrate bias potential of the NMOS transistor. As a layout of these wirings, these wirings (from the first wiring to the sixth wiring) can be arranged in parallel with one another. These wirings may be formed in one metal wiring layer. If there is room to provide any other metal wiring layer, these wirings may be formed in different metal wiring layers and the metal wiring layers may be piled up vertically so that the area of the circuit can be reduced.

Further, when these wirings (from the first wiring to the sixth wiring) are classified into first and second groups by threes so that a plurality of cells each containing at least one of the first and second circuits and PMOS and NMOS transistors are arranged between the first and second groups, a regular cell layout can be achieved. Wirings for supplying substrate bias potentials may be omitted. In this case, these wirings are classified into two groups by twos so that cells are arranged between the two groups.

The present invention can be configured so that circuits according to the present invention are suitably mixed with background-art circuits. A typical example is a semiconductor integrated circuit composed of a logic block having a calculating function, and a memory block having a memory function. Circuits (for example, shown in FIG. 1) including the first and second circuits, and PMOS and NMOS transistors according to the present invention can be arranged in the inside of the logic block.

Alternatively, there is provided a semiconductor integrated circuit comprising a first circuit block and a second circuit block, wherein: the first circuit block includes circuit cells containing PMOS and NMOS transistors; a first pulse signal is supplied to gates of the PMOS transistors; a second pulse signal is supplied to gates of the NMOS transistors; HIGH of the first pulse signal is different from HIGH of the second pulse signal; LOW of the first pulse signal is different from LOW of the second pulse signal; timing of changing the first pulse signal from HIGH to LOW is synchronized with timing of changing the second pulse signal from HIGH to LOW; and timing of changing the first pulse signal from LOW to HIGH is synchronized with timing of changing the second pulse signal from LOW to HIGH.

Specifically, the first circuit block includes a first circuit for generating the first pulse signal, and a second circuit for generating the second pulse signal, the first circuit including PMOS and NMOS transistors having source-drain paths connected in series; and the second circuit including PMOS and NMOS transistors having source-drain paths connected in series.

Further, specifically, the series connected source-drain paths of the PMOS and NMOS transistors of the first circuit are connected between a first potential and a first node; the series connected source-drain paths of the PMOS and NMOS transistors of the second circuit are connected between a second potential and a second node; either one of the second potential and a third potential is supplied to the first node through a first selector; and either one of the first potential and a fourth potential is supplied to the second node through a second selector.

To achieve the aforementioned circuit configuration, the first wiring for feeding the first electric potential, the second wiring for feeding the second electric potential, the third wiring for feeding the third electric potential and the fourth wiring for feeding the fourth electric potential are arranged in the first circuit block so as to be parallel with one another.

On the other hand, a background-art circuit configuration is applied to the second circuit block. That is, the first and second wirings are arranged in the second circuit block so as to be parallel with each other but the third and fourth wirings are not arranged in the second circuit block. If the circuits according to the present invention and the background-art circuits are classified into blocks, wiring space can be saved so that efficient circuit arrangement can be made.

DETAILED DESCRIPTION OF THE EMBODIMENTS

Embodiments of the present invention will be described below with reference to the drawings.

Figure 1:
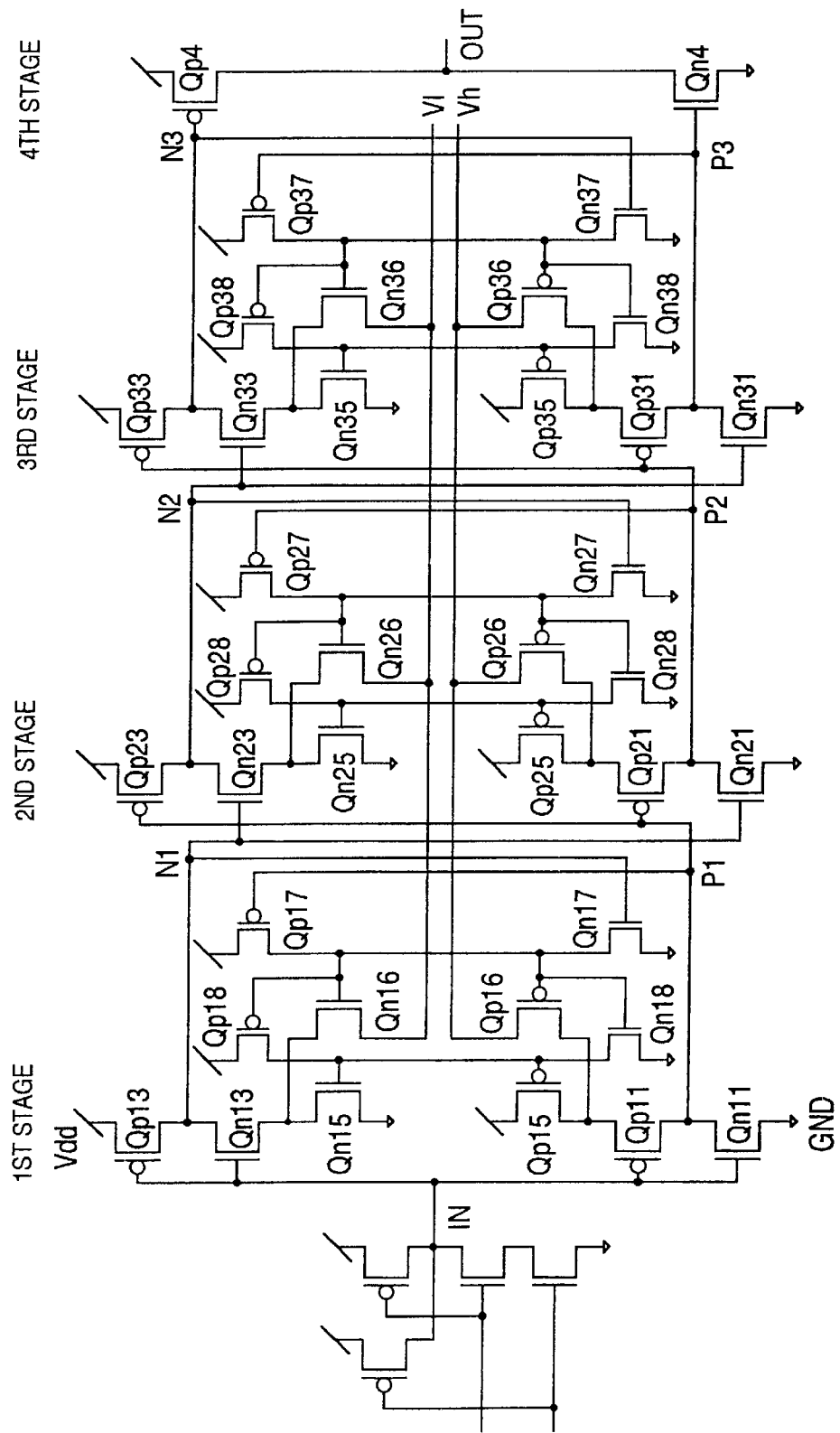
FIG. 1 is a circuit diagram showing a semiconductor integrated circuit according to a first embodiment of the present invention.

FIG. 1 is a circuit diagram showing a semiconductor integrated circuit according to a first embodiment of the present invention. This is an example of a combination of one stage of NAND gate and four stages of inverters. A background-art inverter is constituted by a combination of an NMOS transistor and a PMOS transistor. In this embodiment, first, one inverter is divided into two. For example, one inverter is divided into a first inverter (first CMOS circuit) constituted by a combination of Qp11 and Qn11 and a second inverter (second CMOS circuit) constituted by a combination of Qp13 and Qn13. But, the total channel width of Qp11, Qn11, Qp13 and Qn13 can be set to be equal to the background-art total channel width.

Then, selectors for selecting voltage sources are provided for the inverters respectively. For example, a first selector constituted by a combination of Qp15 and Qp16 is connected to a source of Qp11 constituting the first inverter. A first voltage source having a voltage Vdd is connected to a source of Qp15. A first bias voltage source having a voltage Vh set to satisfy the relations Vdd—Vt<Vh<Vdd (in which Vt is a threshold voltage) is connected to a source of Qp16. Similarly, a second selector constituted by a combination of Qn15 and Qn16 is connected to a source of Qn13 constituting the second inverter. A second voltage source having a voltage 0 is connected to a source of Qn15. A second bias voltage source having a voltage Vl set to satisfy the relations 0<Vl<Vt is connected to a source of Qn16.

Finally, voltage source selection signals generated on the basis of outputs of the first and second inverters by use of delay inverters are supplied to the selectors. For example, outputs of the first and second inverters are connected to gates of Qp17 and Qn17, respectively, of a first delay inverter. An output of the first delay inverter is connected to gates of Qp18 and Qn18 of a second delay inverter. The output of the first delay inverter is also connected to gates of Qp16 and Qn16 constituting the first and second selectors. An output of the second delay inverter is connected to gates of Qp15 and Qn15 constituting the first and second selectors.

Similar circuit configuration is applied also to the second stage (Qp21 to Qp28 and Qn21 to Qn28) and the third stage (Qp31 to Qp38 and Qn31 to Qn38), provided that a background-art inverter configuration of Qp4 and Qn4 is applied to the fourth stage. With respect to the connection at the time of formation of the plurality of stages, an output P1 of the first inverter is supplied only to the PMOS side (Qp21 and Qp23) of the next stage whereas an output N1 of the second inverter is supplied only to the NMOS side (Qn21 and Qn23) of the next stage. This is repeated to thereby constitute a logic circuit.

That is, the second stage in this configuration includes: a first p-channel FET Qp23 having a gate controlled by a first input P1 and having a source-drain path connected between a first operating potential point Vdd and a first node N2; a first n-channel FET Qn23 having a gate controlled by a second input N1 and having a source-drain path connected between the first node N2 and a second node; a second n-channel FET Qn25 having a gate controlled by the first node and having a source-drain path connected between the second node and a second operating potential point GND; a third n-channel FET Qn26 having a gate controlled by the first node N2 and having a source-drain path connected between the second node and a third operating potential point Vl; a second p-channel FET Qp21 having a gate controlled by the first input P1 and having a source-drain path connected between a third node and a fourth node P2; a third p-channel FET Qp25 having a gate controlled by the fourth node P2 and having a source-drain path connected between the first operating potential point Vdd and the third node; a fourth p-channel FET Qp26 having a gate controlled by the fourth node P2 and having a source-drain path connected between a fourth operating potential point Vh and the third node; and a fourth n-channel FET Qn21 having a gate controlled by the second input N1 and having a source-drain path connected between the fourth node P2 and the second operating potential point GND.

Figure 24A:
FIGS. 24A and 24B are circuit diagrams showing a background-art example of three stages of inverters.
Figure 24B:
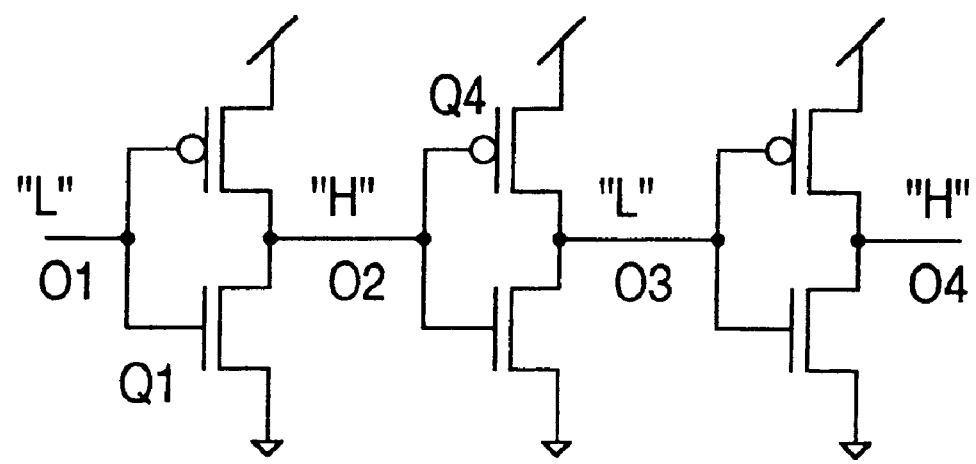

In this embodiment, each of input and output signal lines is divided into two signal lines provided for the PMOS side and the NMOS side respectively. But, one signal line per signal may be provided in the first stage, or the two signal lines may be restored to one signal line per signal in the final fourth stage so that an ordinary logic is applied to the signal (though two kinds of signals are provided as input signals). A logic circuit group is formed thus as described above, so that two signal lines per signal are used in the logic circuit group, and the two signal lines can be restored to one signal line in input/output of the group. This embodiment shown in FIG. 1 may be used in combination with a background-art technique (for example, a circuit shown in FIGS. 24A and 24B).

In this case, an effect is obtained as follows. When, for example, the nodes P1 and N1 are at "L" level, the signal between the nodes N1 and P1 passes through the first delay inverter to be supplied to the gates of Qp16 and Qn16 constituting the second selector to thereby turn off Qp16 and turn on Qn16. Further, the output of the first delay inverter passes through the second delay inverter to be supplied to the gates of Qp15 and Qn15 constituting the first selector to thereby turn on Qp15 and turn off Qn15. Accordingly, the potential at the node P1 is still zero but the potential at the node N1 is raised from zero to Vl.

As a result, when the levels of the nodes P1 and N1 change from "L" to "H", the potential at the node N1, that is, the NMOS input rises more rapidly than that in the background-art inverter configuration.

Figure 2:
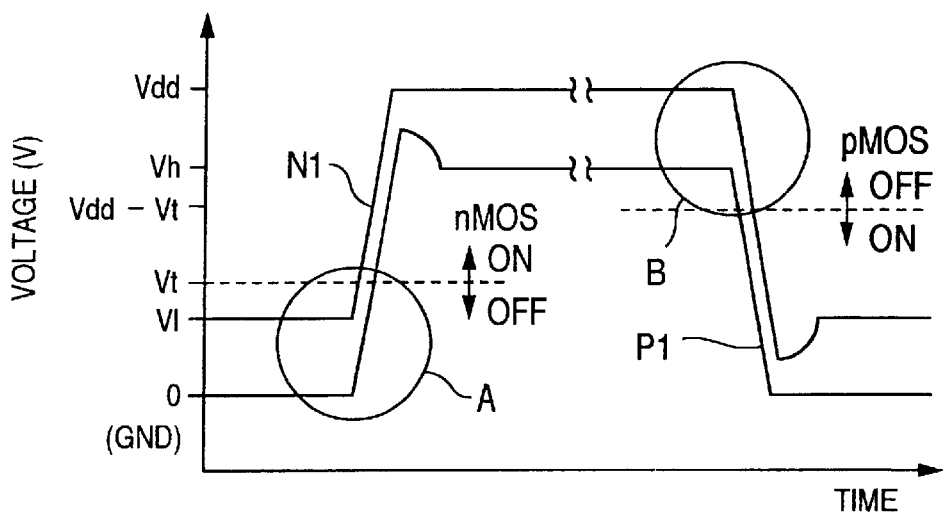
FIG. 2 is a typical graph of input signal waveforms for explaining operational theory in the first embodiment.

FIG. 2 shows the operation of the circuit described above with reference to FIG. 1. In FIG. 2, A is a leading edge portion of the NMOS input. When the levels of the nodes P1 and N1 are "L", the potential at the node P1 is still zero but the potential at the node N1 is raised from zero to Vl. Accordingly, in this embodiment, wasteful time in a voltage range of from zero to Vt before the NMOS is turned on, is reduced. As a result, the operating speed of the circuit is improved.

When the levels of the nodes P1 and N1 are then turned to "H", the signal passes through the delay inverters to be supplied to the selectors in the same manner as in the case of "L" level to thereby turn on Qp16, turn off Qn16 and Qp15 and turn on Qn15. Accordingly, the potential at the node N1 is still Vdd but the potential at the node P1 is reduced from Vdd to Vh.

Also when the levels of the nodes P1 and N1 change from "H" to "L", the potential at P1, that is, the PMOS input falls down more rapidly than that in the background-art inverter configuration. In FIG. 2, B is a trailing edge portion of the PMOS input. Accordingly, the time required for turning on the PMOS is reduced. As a result, the operating speed of the circuit is improved. When the levels of the nodes P1 and N1 then become "L", the potential at the node N1 is raised from zero to Vl for the aforementioned reason to prepare for the next transition.

The aforementioned operation is generalized as follows. The circuit in this embodiment comprises: a circuit for generating a first pulse signal (N1); a circuit for generating a second pulse signal (N2); a first transistor (NMOS transistor) which is turned on at a leading edge of the first pulse signal supplied to a gate of the first transistor; and a second transistor (PMOS transistor) which is turned on at a trailing edge of the second pulse signal supplied to a gate of the second transistor. The difference between the level (Vt) of the gate input signal at a point of time when the first transistor is turned on and the LOW level of the first pulse signal (N1) is smaller than the difference between the level (Vdd−Vt) of the gate input signal at a point of time when the first transistor is turned off and the HIGH level of the first pulse signal (N1). The difference between the level of the gate input signal at a point of time when the second transistor is turned on and the HIGH level of the second pulse signal (N2) is smaller than the difference between the level of the gate input signal at a point of time when the second transistor is turned off and the LOW level of the second pulse signal (N2). It is to be understood that the aforementioned two kinds of signals are used so that transistors can be turned on at a high speed without changing the threshold of the transistors while drivability is kept without changing the amplitude of signals given to the gates of the transistors.

As is obvious from FIG. 2, the first pulse signal is phase-synchronized with the second pulse signal. There is no fear of phase difference between signals supplied to transistors as described preliminarily in JP-A-7-162288. Accordingly, control and design are easy. As is also obvious from FIG. 2, the difference between the level of the gate input signal at a point of time when the first transistor is turned on and the LOW level of the first pulse signal is smaller than the difference between the level of the gate input signal at a point of time when the first transistor is turned on and the LOW level of the second pulse signal, and the difference between the level of the gate input signal at a point of time when the second transistor is turned on and the HIGH level of the second pulse signal is smaller than the difference between the level of the gate input signal at a point of time when the second transistor is turned on and the HIGH level of the first pulse signal.

Figure 3:
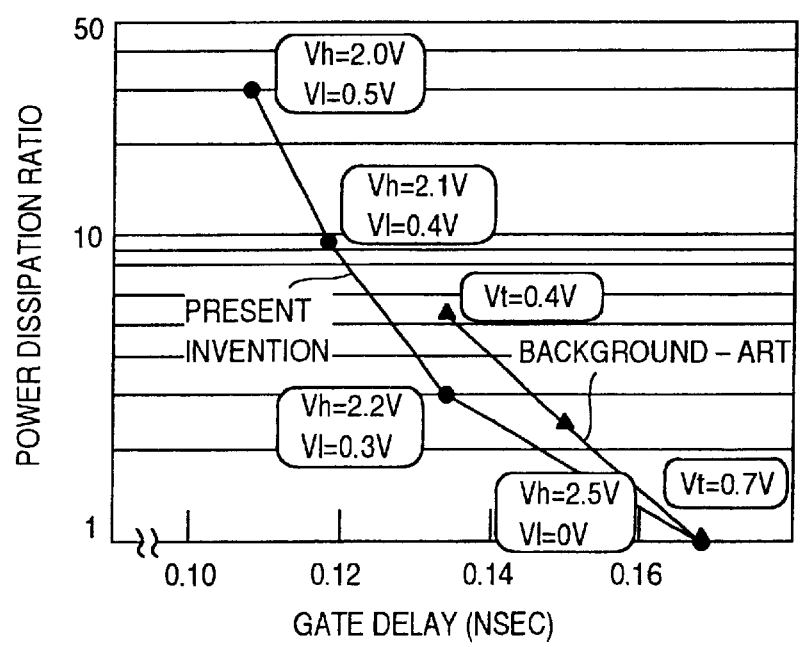
FIG. 3 is a characteristic graph showing the relation between the gate delay and the power dissipation ratio in the first embodiment.

FIG. 3 is a graph in which the abscissa axis represents the gate delay of the inverter according to the present invention and the ordinate axis represents the power dissipation ratio caused by leakage current. The power dissipation ratio is a value normalized on the assumption that the power dissipation of the background-art inverter is 1. In FIG. 3, the triangular marks show results of the background-art inverter. The threshold voltage Vt of the MOS transistors is written by the side of each triangular mark. Further, the circular marks show results of the inverter according to the present invention. The voltages of the bias voltage sources Vh and Vl are written by the side of each circular mark.

In the present invention, the speeding-up effect increases as the potential difference Vdd–Vh increases and as the voltage Vl increases. For example, in the background-art inverter (Vt=0.7) with the power supply Vdd of 2.5 V, the gate delay is 0.168 nsec. On the contrary, in the present invention, the gate delay can be reduced to 0.133 nsec in the case of Vh=2.2 and Vl=0.3 and to 0.108 nsec in the case of Vh=2.0 and Vl=0.5. Incidentally, Vt of the MOS transistors in the present invention is 0.7 uniformly.

On the other hand, the power dissipation ratio in the present invention increases with the advance of the speeding-up effect but the power dissipation ratio in the present invention is smaller than that in the background-art technique in which Vt is lowered to attain speeding-up. For example, in comparison under the condition that the gate delay of the inverter according to the present invention is equal to that of the background-art inverter, the power dissipation ratio in the present invention is 3.0 in the case of Vh=2.2 and Vl=0.3 whereas the power dissipation ratio in the background-art inverter is 5.4 in the case of Vt=0.4. This is because the source-drain voltage of MOS transistors turned on in the background-art inverter is always Vdd whereas the source-drain voltage in the present invention can take Vh or Vdd–Vl so that leak current is reduced on the basis of the influence of short channel.

Figure 4:
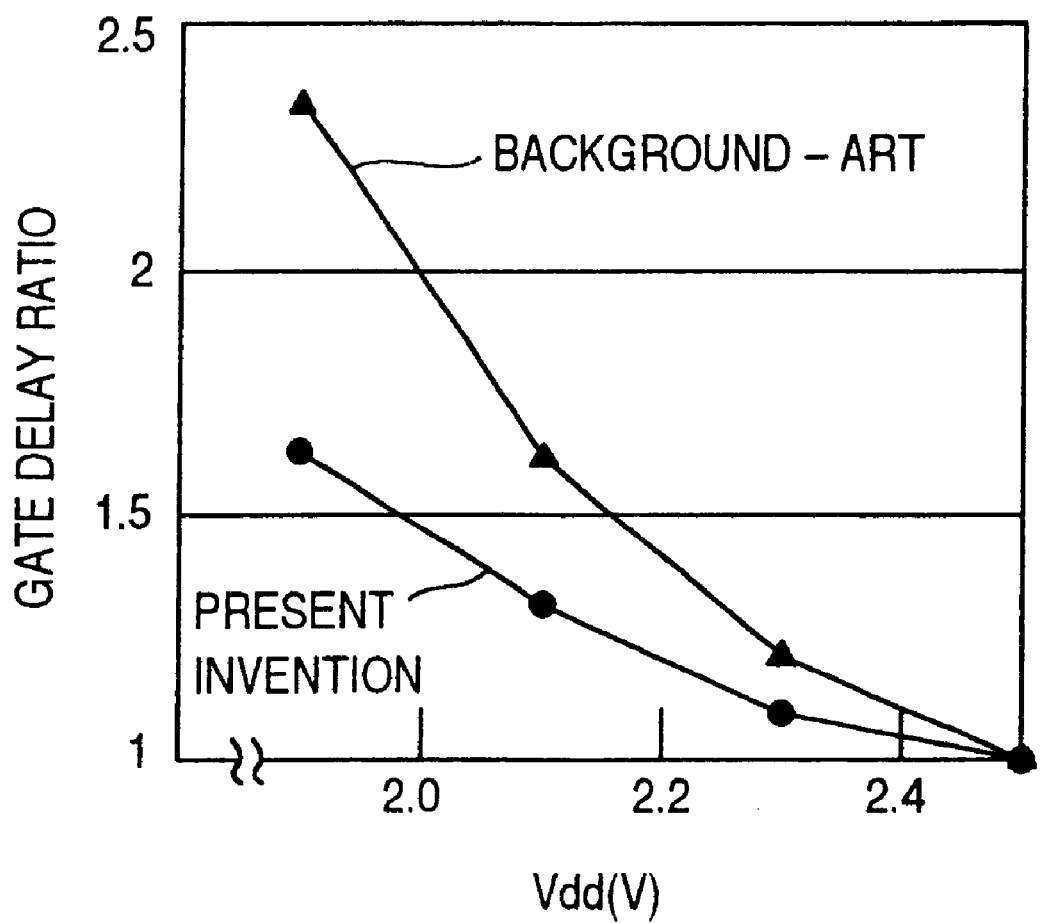
FIG. 4 is a characteristic graph showing the relation between the supply voltage and the gate delay ratio in the first embodiment.

FIG. 4 is a graph in which the abscissa axis represents the power supply voltage Vdd and the ordinate axis represents the gate delay ratio of the inverter. In FIG. 4, the triangular marks show results of the background-art inverter (Vt=0.7), and the circular marks show results of the inverter (Vh=2.0 and Vl=0.5) according to the present invention. The gate delay ratio is a value normalized on the assumption that the gate delay of each inverter with the power supply voltage Vdd of 2.5 V is 1.

When Vdd is lowered, the rate of increase of gate delay in the present invention is reduced compared with the background-art inverter. When, for example, Vdd is 2.1, the gate delay ratio in the background-art inverter is 1.6 whereas the gate delay ratio in the present invention is 1.3. When, for example, Vdd is 1.9, the gate delay ratio in the background-art inverter is 2.3 whereas the gate delay ratio in the present invention is 1.6.

Accordingly, when a plurality of stages according to this embodiment are used in combination, speeding up can be achieved in each stage. Further, the present invention is provided to achieve both a high-seed operation and low leakage current in an active mode. When the voltage of the first bias voltage source is reduced and the voltage of the second bias voltage source is raised in a stand-by mode, the leakage current in the stand-by mode can be reduced. For example, the voltage of the first bias voltage source may be set to be Vdd and the voltage of the second bias voltage source may be set to be zero.

Figure 18:
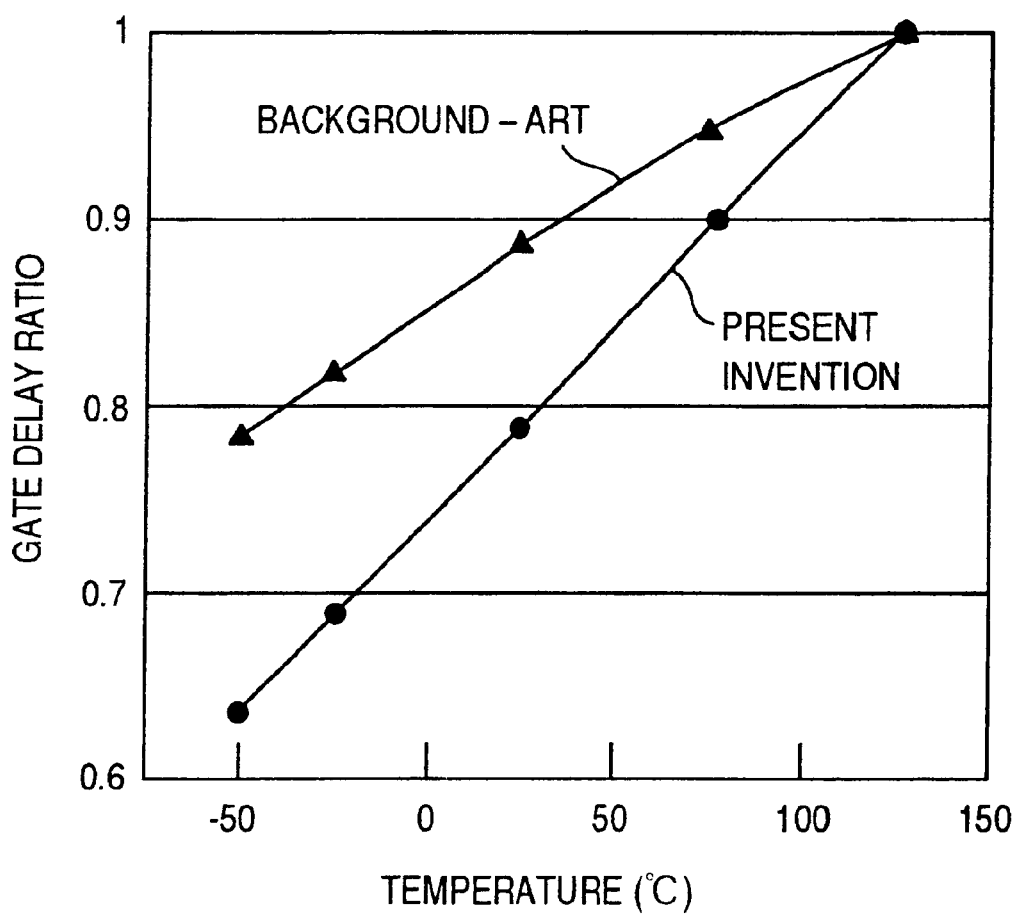
FIG. 18 is a characteristic graph showing the relation between temperature and gate delay ratio in the first embodiment.

FIG. 18 is a graph in which the abscissa axis represents the temperature and the ordinate axis represents the gate delay ratio of the inverter.

In FIG. 18, the triangular marks show results of the background-art inverter, and the circular marks show results of the inverter (Vh=2.2 and Vl=0.3) according to the present invention. The gate delay ratio is a value normalized on the assumption that the gate delay of each inverter under a temperature of 125° C. is 1.

When temperature is lowered, the rate of decrease of gate delay in the present invention is raised compared with the background-art inverter. When, for example, the temperature is 75° C., the gate delay ratio in the background-art inverter is 0.95 whereas the gate delay ratio in the present invention is 0.90. When, for example, the temperature is −50° C., the gate delay ratio in the background-art inverter is 0.79 whereas the gate delay ratio in the present invention is 0.64. The reason is as follows.

Figure 19:
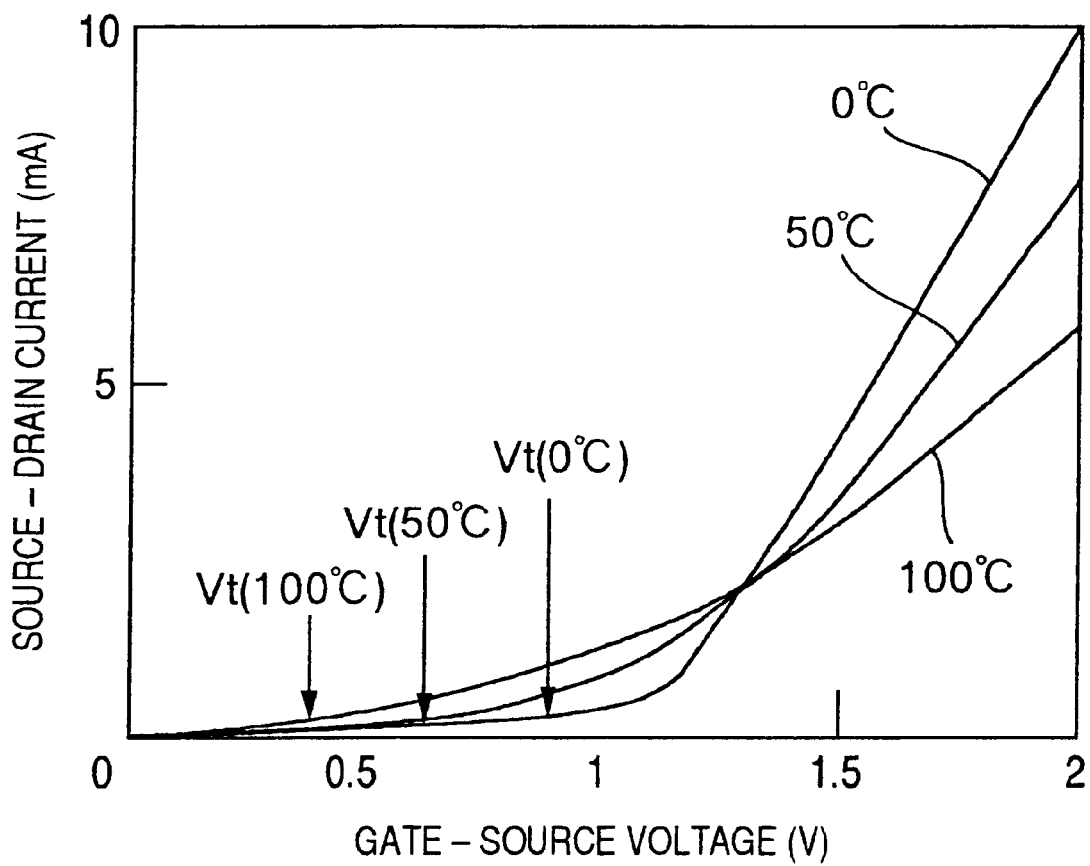
FIG. 19 is a characteristic graph showing the relation between the source-drain current and temperature in an MOS transistor.

FIG. 19 shows the relation between the source-drain current and temperature in an MOS transistor. As the temperature decreases, the source-drain current in the MOS transistor, that is, the drivability of the MOS transistor increases on one hand, while the threshold voltage of the MOS transistor increases on the other hand. In the background-art inverter, the effect of increasing the drivability and the effect of reducing the operating speed on the basis of increase of the threshold voltage cancel each other. In the present invention, however, the effect of reducing the operating speed can be suppressed because the voltage of the bias voltage source Vl is raised and the voltage of the bias voltage source Vh is reduced with the fall of temperature to thereby compensate for the increase of the threshold voltage.

Figure 5:
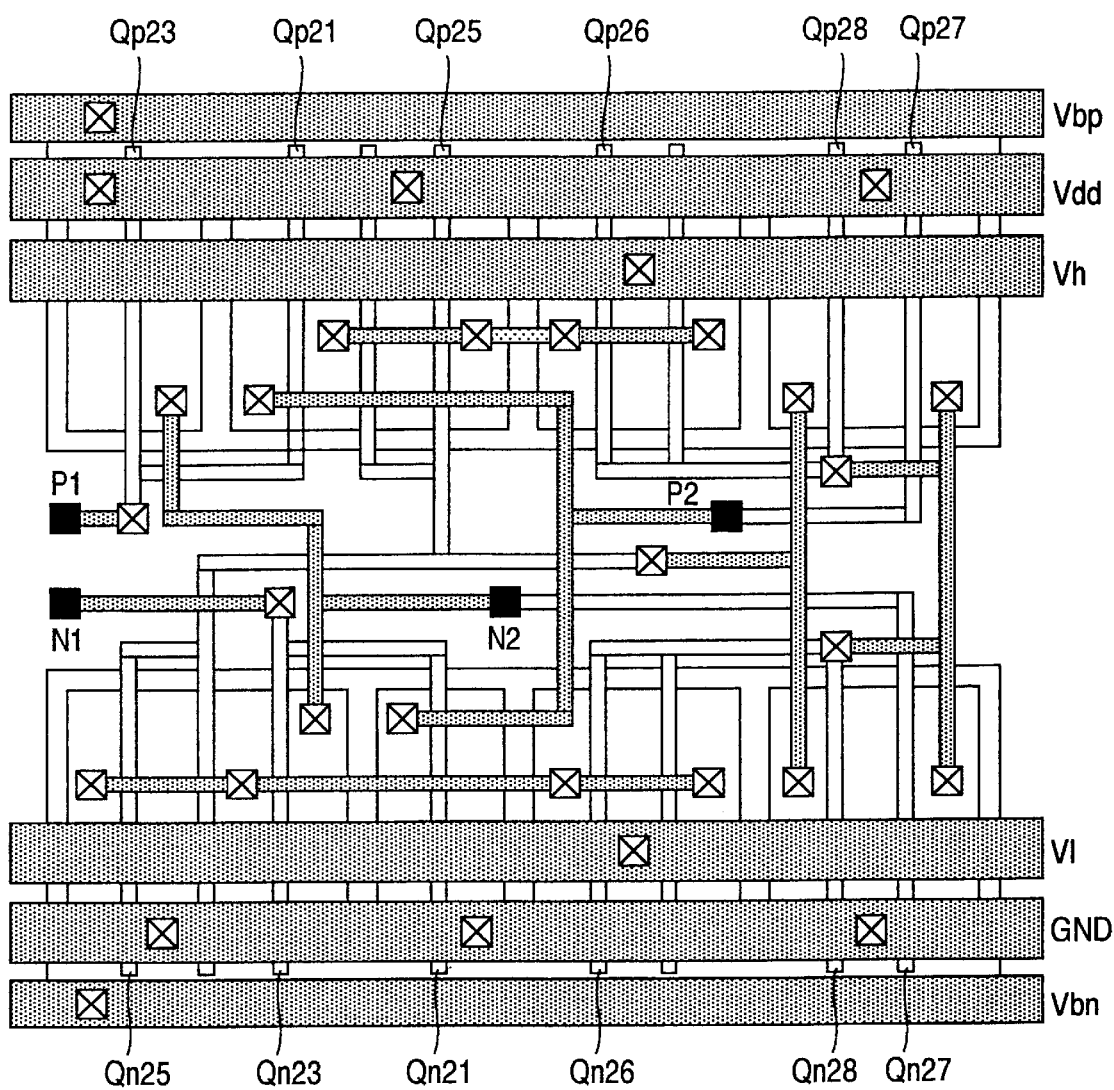
FIG. 5 is a plan view showing a layout scheme of the 2nd-stage inverter gate in the first embodiment.

FIG. 5 is a plan view showing a layout of the second-stage inverter in the embodiment shown in FIG. 1. In FIG. 5, the white-painted region shows a polysilicon layer, and the netted region shows a first metal layer. The names (Qp11 to Qp18 and Qn11 to Qn18) of MOS transistors corresponding to those in FIG. 1 are given to gate electrodes which form channels. The operation of each MOS transistor has been described above. Further, in FIG. 5, the black-painted squares show input-output terminals. N1 and P1 are appended to inputs of NMOS and PMOS transistors respectively. N2 and P2 are appended to outputs of NMOS and PMOS transistors respectively.

In the background-art layout view disclosed, for example, in IEEE International Solid-State Circuits Conference Digest of Technical Papers, 1996, there are provided four kinds of power supply lines consisting of Vdd (first voltage source), GND (second voltage source), Vbp (p-substrate supply voltage source) and Vbn (n-substrate supply voltage source). In the layout view of this embodiment, two kinds of power supply lines consisting of Vh (first bias voltage source) and Vl (second bias voltage source) are required in addition to the above-mentioned four kinds of power supply lines.

The power supply line of Vh is preferably arranged in proximity to and in parallel with the power supply line of Vdd because the power supply line of Vh as well as the power supply line of Vdd supplies power to PMOS. On the other hand, the power supply line of Vl is preferably arranged in proximity to and in parallel with the power supply line of GND because the power supply line of Vl as well as the power supply line of GND supplies power to NMOS. As a result, the power supply lines are not required to be led wastefully.

FIG. 5 shows the case where only one metal layer is used for the power supply lines. However, in the case where two layers or more can be used, for example, the power supply lines of Vdd and Vh may be piled up as separate layers and the power supply lines of GND and Vl may be piled up as separate layers so that the layout area can be reduced.

In this embodiment, the number of elements increases compared with the background-art inverter, so that the layout area increases to about twice. The reason is as follows. The total channel width of the first and second inverters can be set to be equal to that of the background-art inverter. The total channel width of the delay inverters can be set to be smaller than that of the selectors. Accordingly, the increase of the area depends on the selectors. On the other hand, the total channel width of the selectors can be set to be equal to that of the first and second inverters.

For example, it is sufficient if the channel width required of Qp15 and Qp16 constituting the first selector is reduced to be equal to the channel width of Qp11 constituting the first inverter because the first selector is connected to Qp11 in series. Similarly, it is sufficient if the channel width required of Qn15 and Qn16 constituting the second selector is reduced to be equal to the channel width of Qn13 constituting the second inverter because the first selector is connected to Qp13 in series. Incidentally, when the number of elements in a CMOS circuit increases, the increase of the layout area is suppressed compared with the background-art CMOS circuit because the influence of the selectors and delay inverters on the increase of the number of elements is reduced relatively.

Figure 6A:
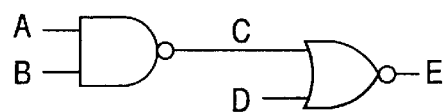
FIG. 6A is a circuit diagram showing a background-art circuit composed of an NAND gate and an NOR gate.
Figure 6B:
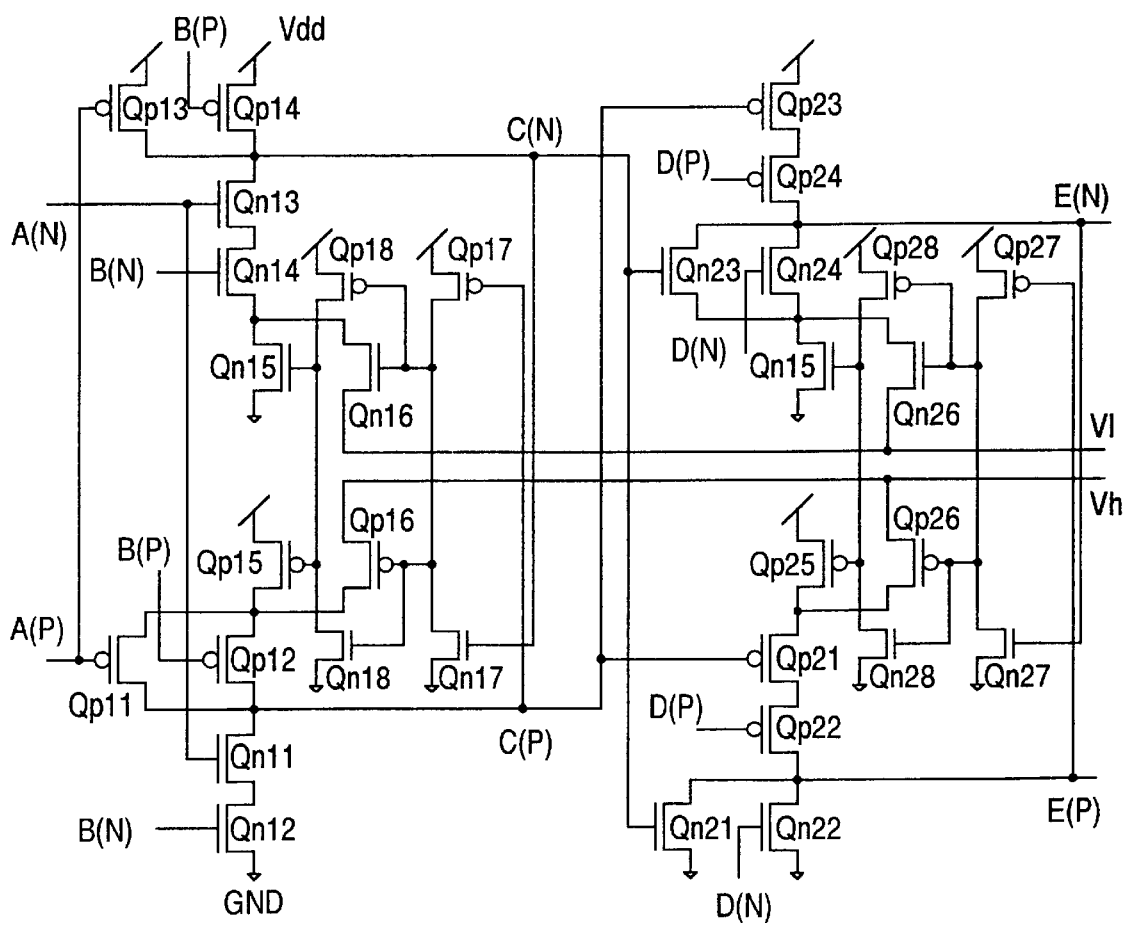
FIG. 6B is a circuit diagram showing a semiconductor integrated circuit according to a second embodiment of the present invention.

FIG. 6B is a circuit diagram showing a semiconductor integrated circuit according to a second embodiment of the present invention. Although the first embodiment shows the case where the present invention is applied to an inverter circuit, this embodiment shows the case where the present invention is applied to another logic circuit constituted by a combination of NAND's and NOR's. Each of a background-art NAND gate and a background-art NOR gate is divided into two and the aforementioned voltage source selectors and delay inverters are provided to thereby form a logic. In this manner, the present invention can be applied to all logics.

Specifically, one NAND gate is first divided into two. That is, one NAND gate in a first stage is divided into a first NAND gate (first CMOS circuit) constituted by a combination of Qp11, Qp12, Qn11 and Qn12 and a second NAND gate (second CMOS circuit) constituted by a combination of Qp13, Qp14, Qn13 and Qn14. Then, a first selector constituted by a combination of Qp15 and Qp16 is connected to sources of Qp11 and Qp12. A second selector constituted by a combination of Qn15 and Qn16 is connected to a source of Qn14. A first voltage source having a voltage Vdd is connected to a source of Qp15. A first bias voltage source having a voltage Vh is connected to a source of Qp16. A second voltage source having a voltage 0 is connected to a source of Qn15. A second bias voltage source having a voltage Vl is connected to a source of Qn16. Finally, outputs of the first and second NAND gates are connected to gates of Qp17 and Qn17, respectively, constituting a first delay inverter. An output of the first delay inverter is connected to gates of Qp18 and Qn18 constituting a second delay inverter. The output of the first delay inverter is also connected to gates of Qp16 and Qn16 constituting the first and second selectors. An output of the second delay inverter is connected to gates of Qp15 and Qn15 constituting the first and second selectors.

One NOR gate in a second stage is also divided into two. That is, one NOR gate in a second stage is divided into a first NOR gate (first CMOS circuit) constituted by a combination of Qp21, Qp22, Qn21 and Qn22 and a second NOR gate (second CMOS circuit) constituted by a combination of Qp23, Qp24, Qn23 and Qn24. Then, a first selector constituted by a combination of Qp25 and Qp26 is connected to a source of Qp21. A second selector constituted by a combination of Qn25 and Qn26 is connected to sources of Qn23 and Qn24. A first voltage source having a voltage Vdd is connected to a source of Qp25. A first bias voltage source having a voltage Vh is connected to a source of Qp26. A second voltage source having a voltage 0 is connected to a source of Qn25. A second bias voltage source having a voltage Vl is connected to a source of Qn26. Finally, outputs of the first and second NOR gates are connected to gates of Qp27 and Qn27, respectively, constituting a first delay inverter. An output of the first delay inverter is connected to gates of Qp28 and Qn28 constituting a second delay inverter. The output of the first delay inverter is also connected to gates of Qp26 and Qn26 constituting the first and second selectors. An output of the second delay inverter is connected to gates of Qp25 and Qn25 constituting the first and second selectors.

Further, the output of the first NAND gate in the first stage is supplied to gates of the PMOS transistors Qp21 and Qp23 in the second stage. The output of the second NAND gate in the first stage is supplied to gates of the NMOS transistors Qn21 and Qn23 in the second stage.

Also in the aforementioned configuration, a speeding-up effect is obtained in the same manner as in the first embodiment. That is, the present invention can be applied to various kinds of logics using CMOS circuits composed of PMOS transistors and NMOS transistors.

Figure 16A:
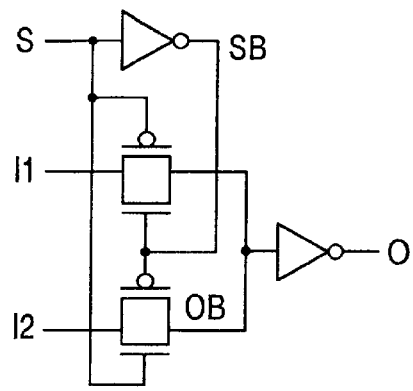
FIG. 16A is a circuit diagram showing a background-art selector circuit.
Figure 16B:
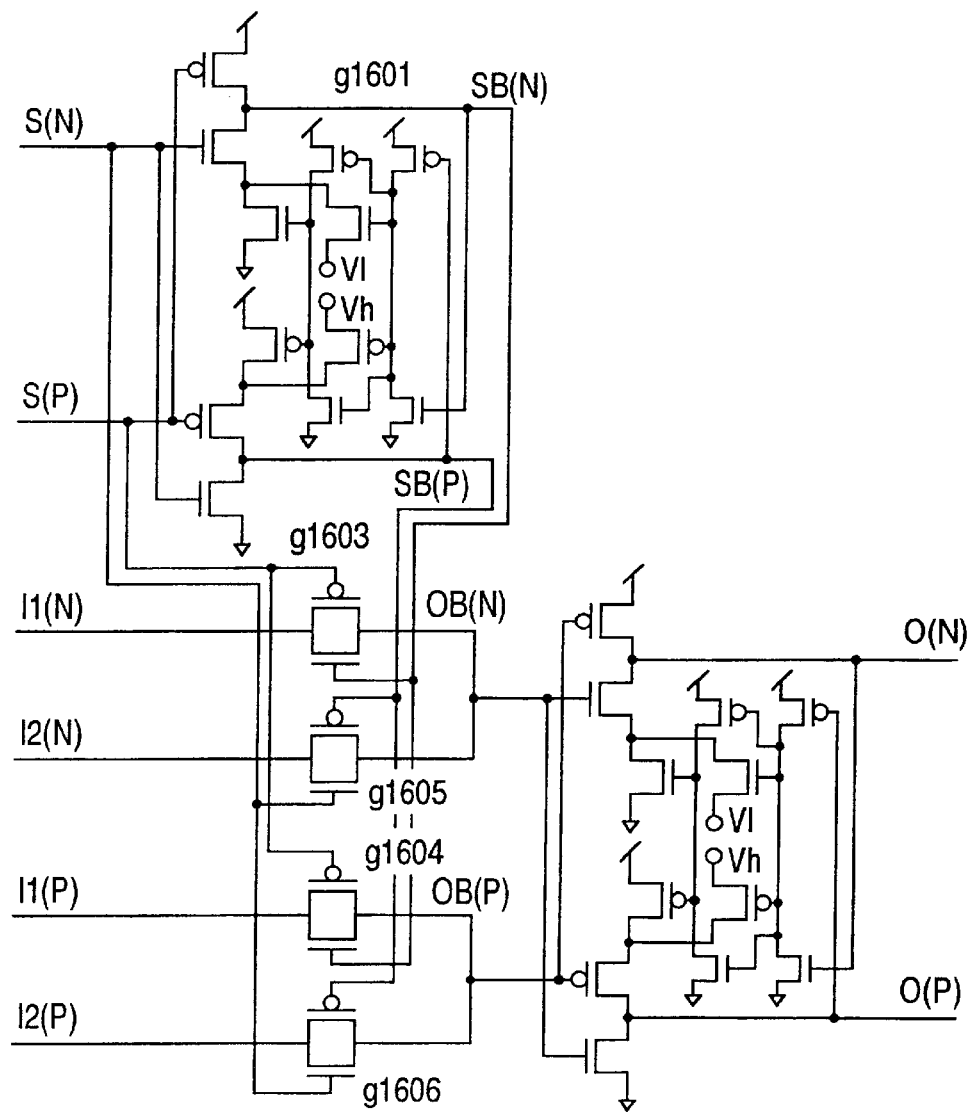
FIG. 16B is a circuit diagram showing a semiconductor integrated circuit according to a third embodiment of the present invention.

FIG. 16B is a circuit diagram showing a semiconductor integrated circuit according to a third embodiment of the present invention. This embodiment shows the case where the present invention is applied to a selector circuit using transmission gates. The point of difference between the selector circuit shown in FIG. 16B according to the present invention and a background-art selector circuit shown in FIG. 16A is in that inverters constituting the background-art selector circuit are replaced by inverters according to the present invention and that each of transmission gates is divided into two.

Specifically, select signals S(N) and S(P) are first supplied to an inverter g1601 according to the present invention. Data signals I1(N) and I1(P) are supplied to transmission gates g1603 and g1604 respectively. Data signals I2(N) and I2(P) are supplied to transmission gates g1605 and g1606 respectively. Then, an output SB(N) of the inverter g1601 is connected to gates of NMOS transistors constituting the transmission gates g1603 and g1604. S(P) is connected to gates of PMOS transistors constituting the transmission gates g1603 and g1604. S(N) is connected to gates of NMOS transistors constituting the transmission gates g1605 and g1606. An output SB(P) of the inverter g1601 is connected to gates of PMOS transistors constituting the transmission gates g1605 and g1606. Finally, an output OB(N) of the transmission gates g1603 and g1605 and an output OB(P) of the transmission gates g1604 and g1606 are supplied to an inverter g1602 according to the present invention, so that output signals O(N) and O(P) of the selector circuit are taken out. Also in the aforementioned configuration, a speeding-up effect is obtained in the same manner as in the first embodiment.

Figure 17A:
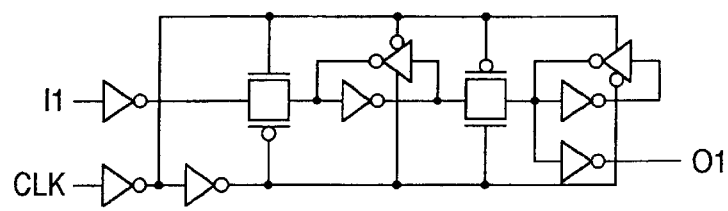
FIG. 17A is a circuit diagram showing a background-art flip-flop circuit.
Figure 17B:
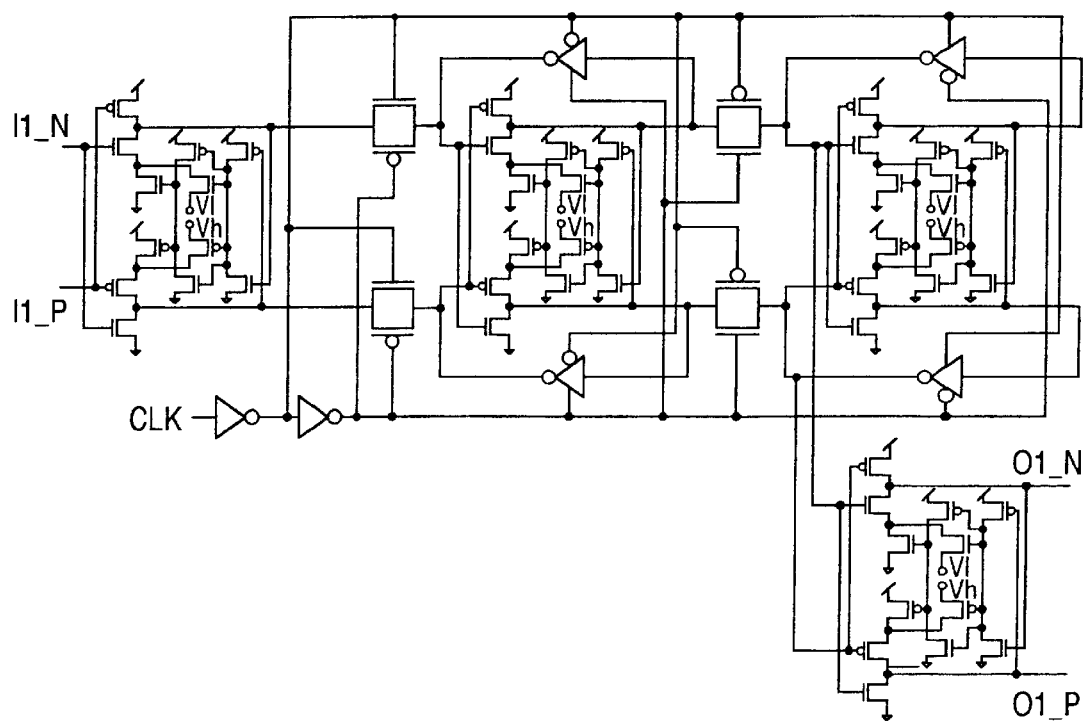
FIG. 17B is a circuit diagram showing a semiconductor integrated circuit according to a fourth embodiment of the present invention.

FIG. 17B is a circuit diagram showing a semiconductor integrated circuit according to a fourth embodiment of the present invention. This embodiment shows the case where the present invention is applied to a flip-flop circuit using transmission gates. The point of difference between the flip-flop circuit shown in FIG. 17B according to the present invention and a background-art flip-flop circuit shown in FIG. 17A is in that an inverter for propagating an input signal I1 is replaced by a new one according to the present invention and that each of transmission gates is divided into two. These changes can be made in the same manner as in the third embodiment. Also in the aforementioned configuration, a speeding-up effect is obtained in the same manner as in the first embodiment.

Figure 7:
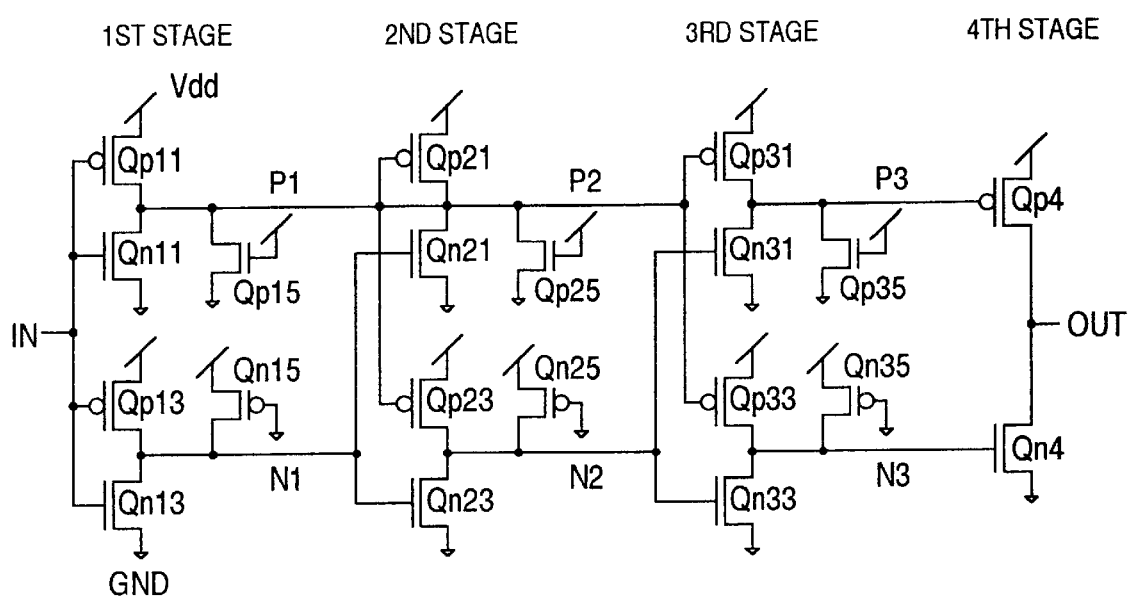
FIG. 7 is a circuit diagram showing a semiconductor integrated circuit according to a fifth embodiment of the present invention.

FIG. 7 is a circuit diagram showing a semiconductor integrated circuit according to a fifth embodiment of the present invention. The point of difference between this embodiment and the first embodiment is in that the voltage source selectors and the delay inverters are replaced by resistors for connecting outputs to voltage sources. For example, one inverter in a first stage is divided into two. That is, one inverter is divided into a first inverter (first CMOS circuit) constituted by a combination of Qp11 and Qn11 and a second inverter (second CMOS circuit) constituted by a combination of Qp13 and Qn13. Then, an output of the first inverter is connected to a drain of an MOS transistor which is constituted by Qn15 and used as a resistor. A first voltage source having a voltage Vdd is connected to a gate of Qn15. A second voltage source having a voltage 0 is connected to a source of Qn15. Similarly, an output of the second inverter is connected to a drain of an MOS transistor which is constituted by Qp15 and used as a resistor. The second voltage source is connected to a gate of Qp15. The first voltage source is connected to a source of Qp15.

Accordingly, the wasteful time required for turning on the NMOS and PMOS transistors can be reduced in the same manner as in the first embodiment, so that an effect of improving the operating speed is obtained.

Specifically, when the levels of nodes P1 and N1 are "L", the potential at the node P1 is still zero but the potential at the node N1 is raised to a value (>0) as a result of dividing Vdd on the basis of the resistance proportion of Qn13 and Qp15 because Qn13 constituting the second inverter and Qp15 constituting the MOS transistor used as a resistor are turned on. As a result, when the levels of the nodes P1 and N1 change from "L" to "H", the NMOS input, N1, rises rapidly compared with the background-art inverter.

Figure 8:
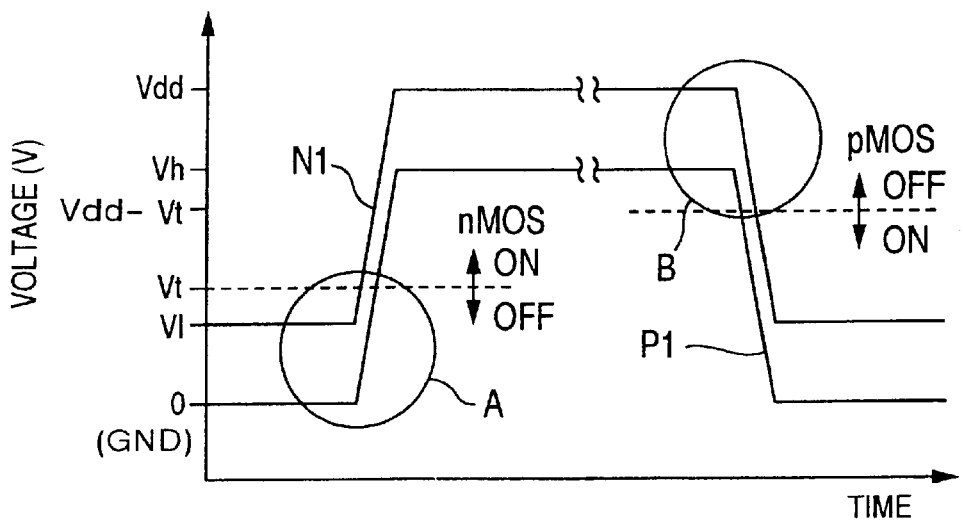
FIG. 8 is a typical graph of input signal waveforms for explaining operational theory in the fifth embodiment.

FIG. 8 shows operating waveforms in the circuit described above with reference to FIG. 7. In FIG. 8, "A" shows a leading edge portion of an NMOS input. When the levels of the nodes P1 and N1 are contrariwise "H", the potential at the node N1 is still Vdd but the potential at the node P1 is reduced to a value (<Vdd) as a result of dividing Vdd on the basis of the resistance proportion of Qp11 and Qn15 because Qp11 constituting the first inverter and Qn15 constituting the MOS transistor used as a resistor are turned on. As a result, when the levels of the nodes P1 and N1 change from "H" to "L", the PMOS input, P1, falls rapidly compared with the background-art inverter. In FIG. 8, EBB shows this operation.

In the aforementioned configuration, the number of MOS transistors used as resistors increases by two compared with the background-art inverter but the number of elements can be reduced compared with the first embodiment. Furthermore, the two kinds of bias voltage sources required of the first embodiment are needless.

To perform a normal operation, however, it is necessary that the channel width of Qp15 is determined so that the potential at the node N1 in the "L" level is not larger than Vt and that the channel width of Qn15 is determined so that the potential at the node P1 in the "H" level is larger than Vdd−Vt. Further, since a DC path is formed between the first and second voltage sources by the MOS transistor used as a resistor, there is a higher leakage current compared with the first embodiment. Further, when the gate potential of Qn15 is reduced and the gate potential is raised in the stand-by mode, the leakage current in the stand-by mode can be reduced. For example, the gate voltages of Qn15 and Qp15 may be preferably set to zero and Vdd respectively.

Figure 9:
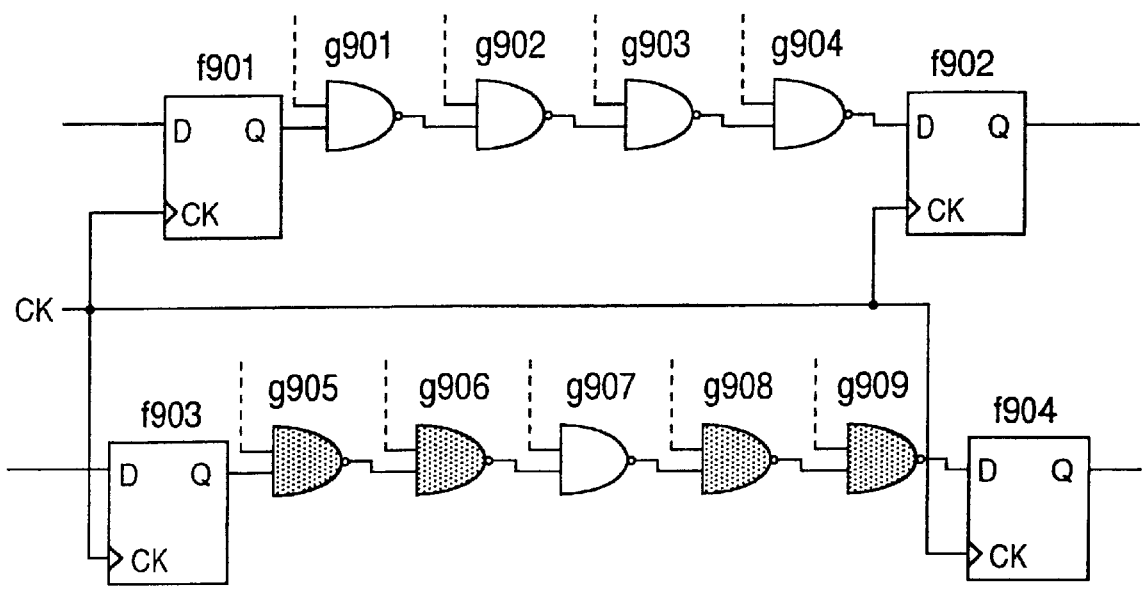
FIG. 9 is a circuit diagram showing a semiconductor integrated circuit according to a sixth embodiment of the present invention.

FIG. 9 is a circuit diagram showing a semiconductor integrated circuit according to a sixth embodiment of the present invention. Description will be made hereafter upon the case where attention is paid to delay of signal paths constituting the semiconductor integrated circuit to use circuits according to the present invention and background-art circuits appropriately to thereby suppress the leakage current while achieving a target operating frequency.

The circuit shown in FIG. 9 is constituted by flip-flop's f901 to f904, and NAND gates g901 to g909. For example, to operate this circuit at 250 MHz, the delay of a path from a point of time when a clock signal CK is supplied to the flip-flop f901 to a point of time when a logic signal reaches the flip-flop f902 needs to be not larger than 4 nsec, and the delay of a path from a point of time when the clock signal CK is supplied to the flip-flop f903 to a point of time when the logic signal reaches the flip-flop f904 needs to be not larger than 4 nsec.

Assume now that a delay of 1 nsec occurs when an NAND gate is constituted by a background-art circuit and that a delay of 0.7 nsec occurs when an NAND gate is constituted by a circuit according to the present invention. The NAND gates g905 to g909 shown as the netted portions in FIG. 9 are constituted by circuits according to the present invention. The NAND gates shown as the white-painted portions in FIG. 9 are constituted by background-art circuits. Accordingly, the delay of a path from the flip-flop f901 to the flip-flop f902 is 4 nsec and the delay of a path from the flip-flop f903 to the flip-flop f904 is 3.8 nsec. Thus, each of the delays satisfies the target condition that the delay is not larger than 4 nsec. Incidentally, if all the NAND gates are constituted by background-art circuits, the delay of a path from the flip-flop f903 to f904 is 5 nsec.

On the other hand, a leakage current will be considered below. Assume now that leakage current of 1 pA occurs when an NAND gate is constituted by a background-art circuit and that leakage current of 10 pA occurs when an NAND gate is constituted by a circuit according to the present invention. When all the NAND gates are constituted by circuits according to the present invention, the total leakage current is 90 pA. However, when circuits according to the present invention are mixed with background-art circuits as shown in FIG. 9, the total leakage current can be reduced to 45 pA.

Figure 10:
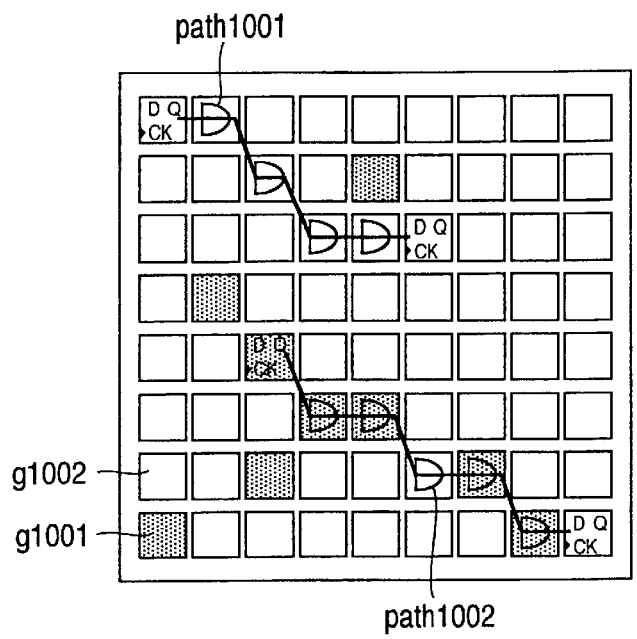
FIG. 10 is a view of arrangement of logic gates in the sixth embodiment.

FIG. 10 is a plan view showing a layout of the semiconductor integrated circuit shown in FIG. 9. In FIG. 10, all logic gates are typically expressed in rectangles. A netted rectangle, for example, g1001, expresses a logic gate constituted by a circuit according to the present invention. A white-painted rectangular, for example, g1002, expresses a logic circuit constituted by a background-art circuit. In FIG. 10, path1001 shows a path from f901 to f902 in FIG. 9, and path1002 shows a path from f903 to f904 in FIG. 9.

Figure 11:
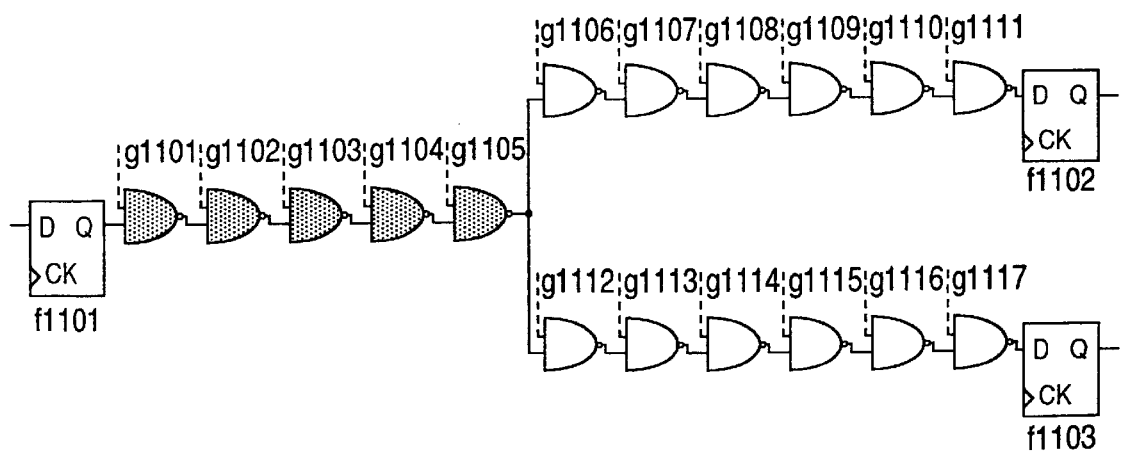
FIG. 11 is a circuit diagram showing a semiconductor integrated circuit according to a seventh embodiment of the present invention.

FIG. 11 is a circuit diagram showing a semiconductor integrated circuit according to a seventh embodiment of the present invention. Description will be made hereafter upon the case where a large number of circuits according to the present invention are used as common logic gates in order to minimize use of circuits according to the present invention when circuits according to the present invention are mixed with background-art circuits appropriately in a plurality of signal paths with common logic gates.

The circuit shown in FIG. 11 is constituted by flip-flops f1101 to f1103, and logic gates g1101 to g1117. For example, the delay of a path from f1101 to f1102 needs to be not larger than 9.5 nsec and the delay of a path from f1101 to f1103 needs to be not larger than 9.5 nsec. Each of the paths is constituted by eleven logic gates. To achieve a delay of 9.5 nsec, at least five elements need to be constituted by circuits according to the present invention.

With the configuration shown in FIG. 11, the number of logic gates constituted by circuits according to the present invention can be minimized. The total leakage current in this configuration is 62 pA. That is, the total leakage current can be reduced greatly compared with the total leakage current of 125 pA generated when the logic gates other than the common logic gates are also constituted by circuits according to the present invention.

Figure 12:
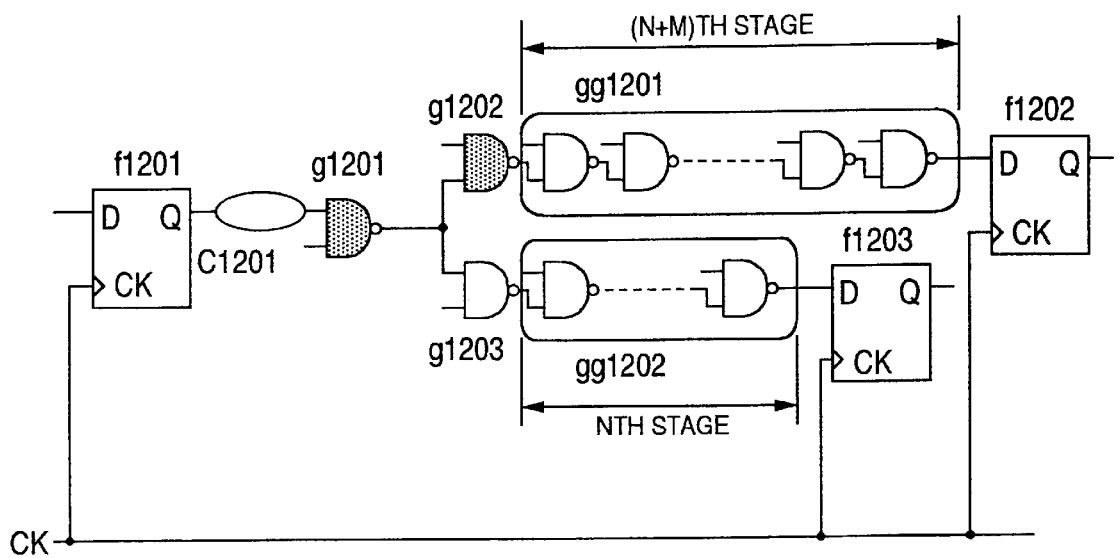
FIG. 12 is a circuit diagram showing a semiconductor integrated circuit according to an eighth embodiment of the present invention.

FIG. 12 is a circuit diagram showing a semiconductor integrated circuit according to an eighth embodiment of the present invention. Description will be made hereafter upon the case where a plurality of signal paths-are provided with common logic gates including a common logic gate located as a confluent or branch place and constituted by a circuit according to the present invention and where a circuit according to the present invention is used as a logic gate which is adjacent to the logic gate located in the confluent or branch place and which is larger in path delay.

The circuit shown in FIG. 12 has two paths. A first path extends from a flip-flop f1201 to a flip-flop f1202 via a circuit c1201, logic gates g1201 and g1202 and a logic gate group gg1201. A second path extends from the flip-flop f1201 to a flip-flop f1203 via the circuit c1201, logic gates g1201 and g1203 and a logic gate group gg1202. The circuit c1201 is constituted by a logic gate or a plurality of logic gates. Assume now that each of the two paths exceeds a target delay when all logic gates are constituted by background-art circuits uniformly. As described above, the logic gate g1201 common to the two paths is constituted by a circuit according to the present invention. Pay attention to the logic gate groups gg1201 and gg1202. The logic gate group gg1202 is constituted by N stages of logic gates. The logic gate group gg1201 is constituted by N+M stages of logic gates. Accordingly, the delay of the first path including the logic gate group gg1201 is larger than the delay of the second path including the logic gate group gg1202.

As a countermeasure to this problem, the logic gate g1202 in the first path which fans out from the logic gate g1201 constituted by a circuit according to the present invention is constituted by a circuit according to the present invention. Further, some of the logic gates in the group gg1201 may be constituted by circuits according to the present invention if necessary.

Figure 13:
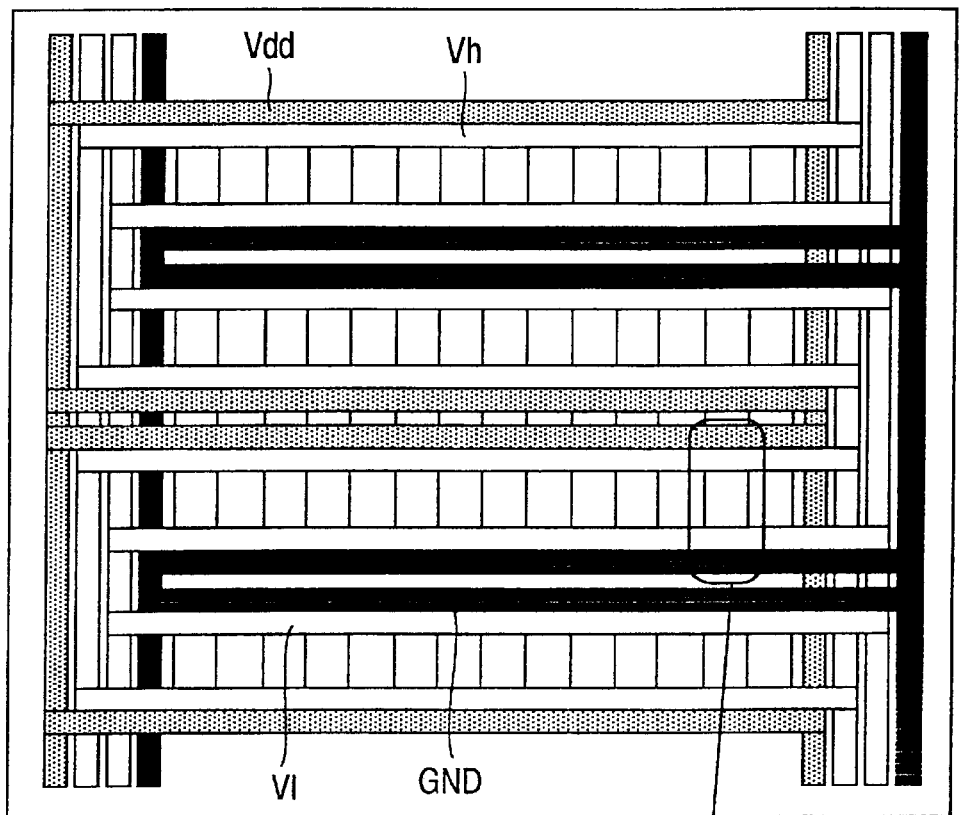
FIG. 13 is a view of arrangement of potential supply lines in a semiconductor integrated circuit according to the present invention.
Figure 13:
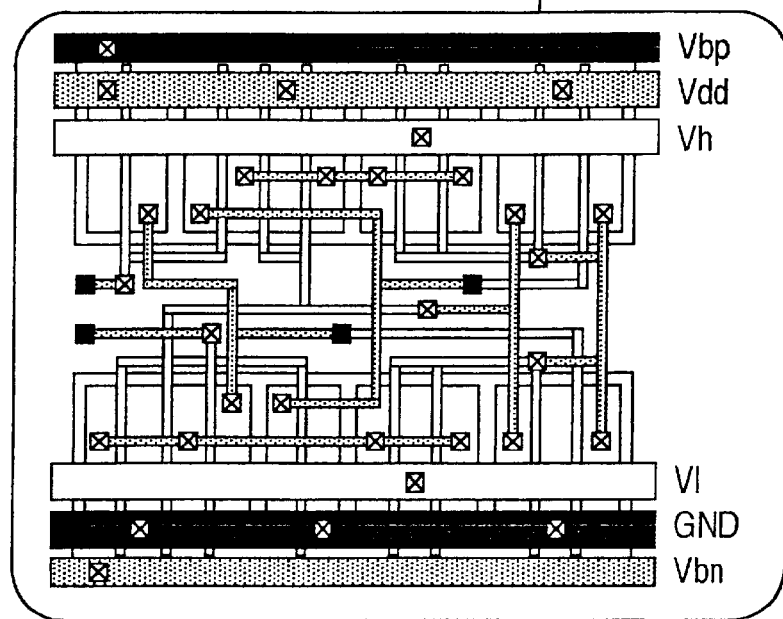

FIG. 13 is a view of arrangement of potential supply lines in a semiconductor integrated circuit according to the present invention.

FIG. 13 shows the case where a plurality of logic gates are aligned in rows and the rows are arranged side by side in a column direction so that the logic gates are arranged two-dimensionally on the semiconductor integrated circuit and where operating potential supply lines are arranged for supplying voltages. In FIG. 13, internal patterns of the logic gates are omitted so that the logic gates are expressed in mere rectangles for the sake of simplification.

FIG. 13 shows the case where a voltage supply line (Vdd) with a voltage Vdd, a voltage supply line (GND) with a voltage 0, a voltage supply line (Vh) with a voltage Vh and a voltage supply line (Vl) with a voltage Vl are arranged in parallel with the logic gate rows. The voltage supply lines are further arranged in left and right sides of the rows for the purpose of reinforcement so as to be perpendicular to the rows. When a layout is made so that the voltage supply lines are arranged regularly in column and row directions in the aforementioned manner, increase of the layout area can be suppressed.

Electric potentials may be supplied to the voltage supply lines Vh and Vl, respectively, from the outside directly. Alternatively, internal voltage generators may be provided to supply electric potentials internally to the voltage supply lines Vh and Vl respectively.

Figure 20A:
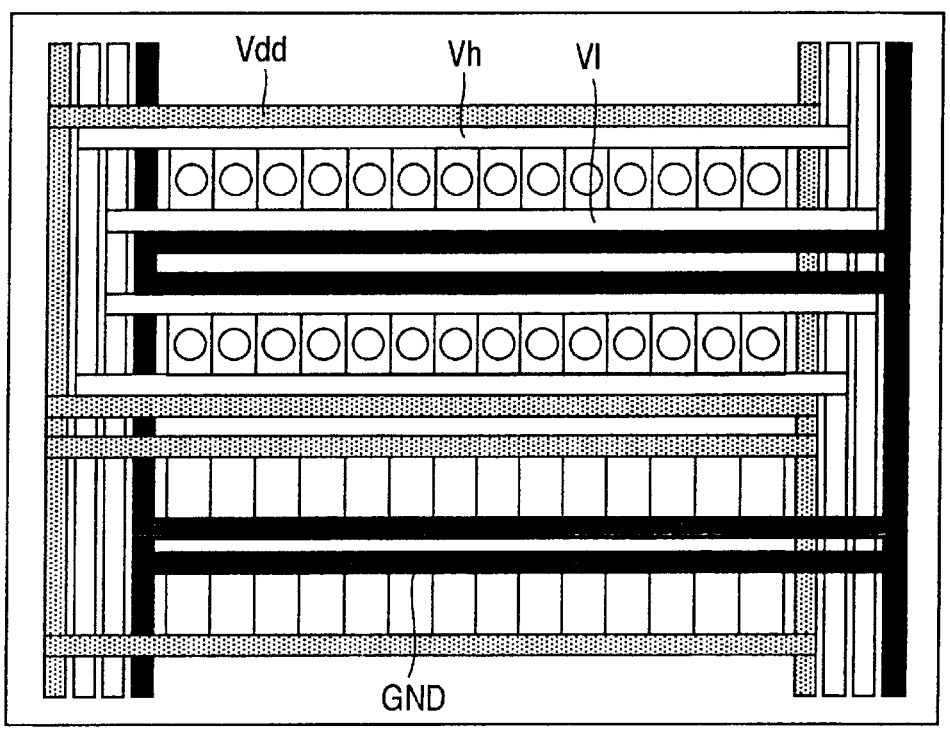
FIGS. 20A and 20B are views of arrangement of logic gates in a semiconductor integrated circuit according to the present invention.
Figure 20B:
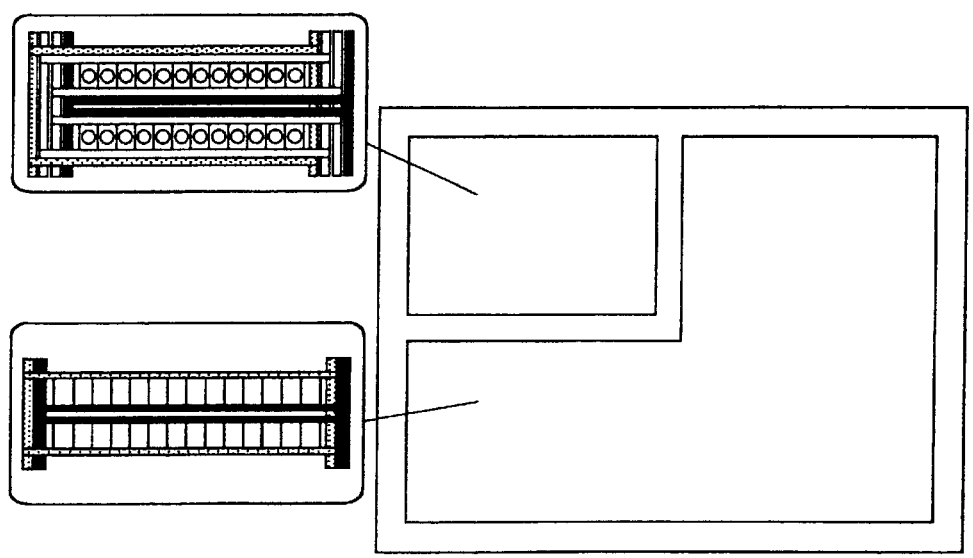

FIGS. 20A and 20B are views of arrangement of logic gates in a semiconductor integrated circuit according to the present invention. In the present invention, it is necessary to provide new voltage supply lines Vh and Vl. Accordingly, the layout area of the circuit according to the present invention increases compared with the background-art circuit. However, when logic gates according to the present invention are arranged as collectively as possible, the increase of the area can be suppressed more greatly.

FIG. 20A shows the case where a plurality of logic gate are aligned in rows and the rows are set in a column direction so that the logic gates are arranged two-dimensionally on a semiconductor integrated circuit and where operating potential supply lines are arranged for supplying voltages. In FIG. 20A, internal patterns of logic gates are omitted so that the logic gates are expressed in mere rectangles for the sake of simplification. The rectangles with circular marks show logic gates according to the present invention. The rectangles having no circular marks show background-art logic gates.

FIG. 20B shows the case where a region of arrangement of the logic gates according to the present invention and a region of arrangement of the background-art logic gates are mixed in the area ratio of 1:3. The area ratio is determined on the basis of the target operating frequency, the target leakage current and the logic circuits to be mounted on the semiconductor integrated circuit. When the present invention is applied to a gate array, the rough value of the rate of use of logic gates according to the present invention is estimated before a substrate is formed.

Figure 14:
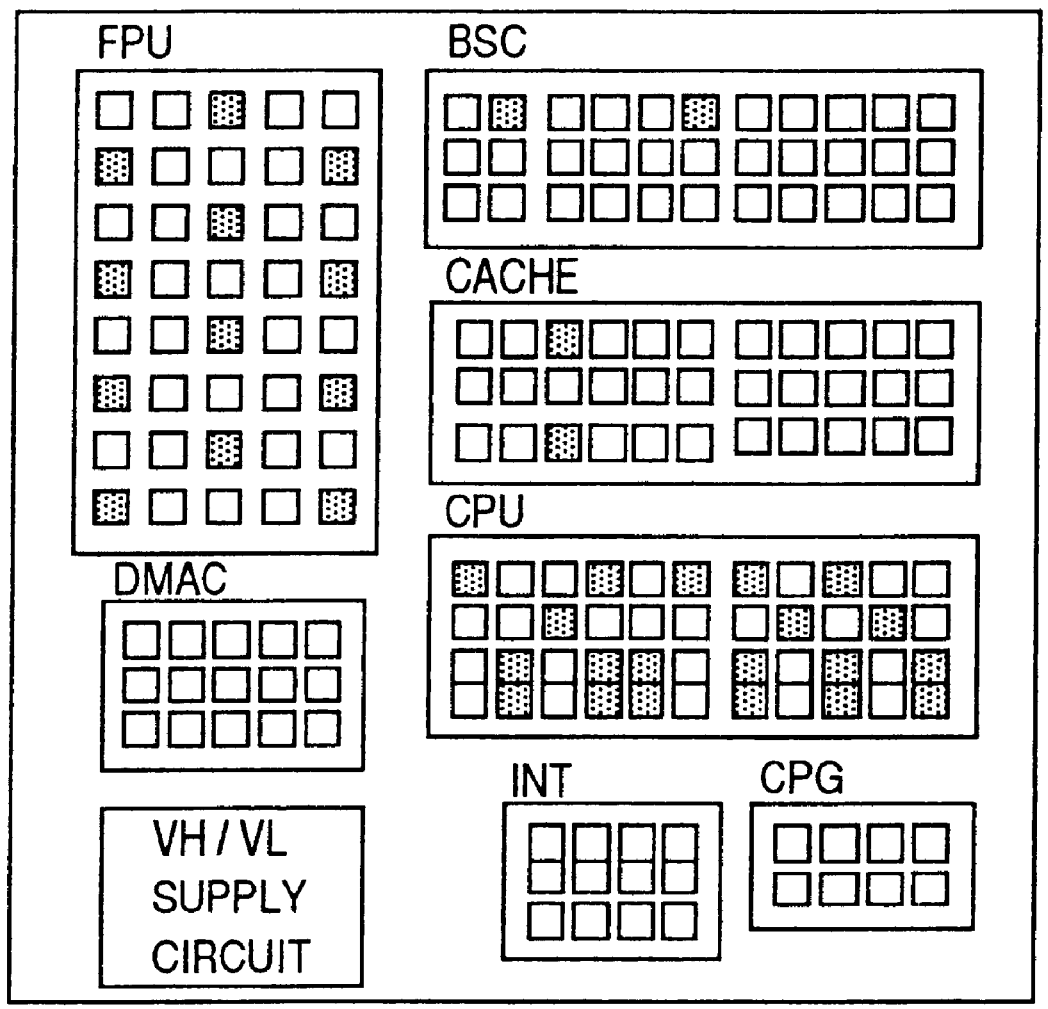
FIG. 14 is a typical view showing an embodiment in which a semiconductor integrated circuit according to the present invention is applied to a microprocessor.

FIG. 14 shows the case where a semiconductor integrated circuit according to the present invention is applied to a microprocessor. Main constituent blocks of the microprocessor include an CPU (central processing unit), an FPU (floating point processing unit), a cache (internal memory), a BSC (bus control), a DMA (direct memory access), a CPG (clock control), an INT (interruption control), a Vh and Vl supply circuit block, and so on. A layout of cells in each block is expressed typically in rectangles. Among the cells in each block, the netted cells are constituted by circuits according to the present invention and the white-painted cells are constituted by background-art circuits. For example, it is to be understood that a block with a large number of timing critical paths, such as the CPU, the FPU, or the like, has a large number of cells constituted by circuits according to the present invention. On the other hand, a block with room for timing, such as the INT, or the like, has a low rate of cells constituted by circuits according to the present invention.

Figure 21:
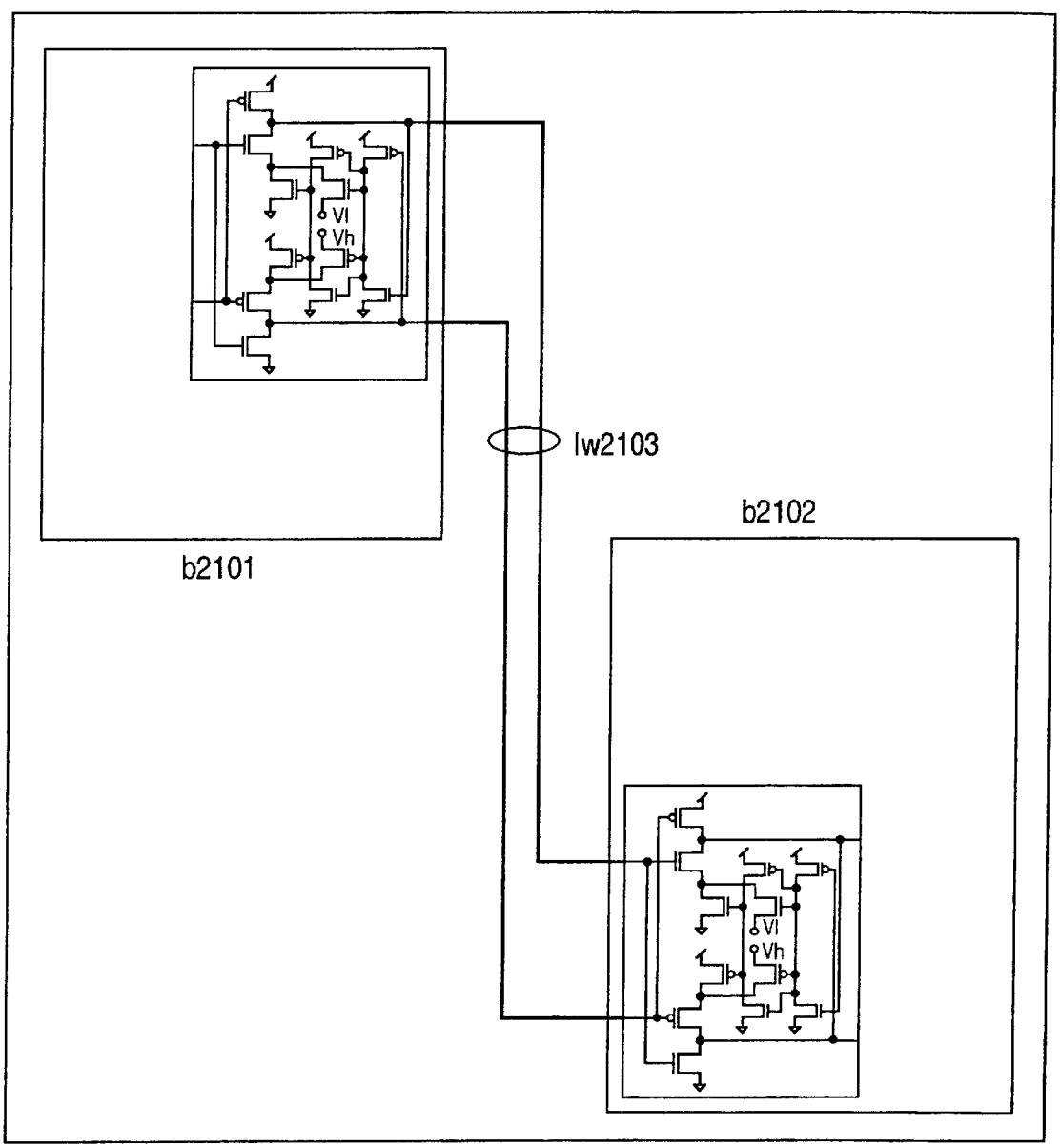
FIG. 21 is a typical diagram showing an embodiment in which a semiconductor integrated circuit according to the present invention is applied to an interblock buffer.

FIG. 21 shows the case where a semiconductor integrated circuit according to the present invention is applied to an interblock buffer. This shows a state in which an output signal of a block b2101 is transmitted to a block b2102 through long line wire lw2103. Logical gates according to the present invention are used at an output end of b2101 and an input end of b2102. Although FIG. 21 shows the case where inverters are used, it is a matter of course that the present invention is not limited thereto and that the buffer can be achieved by various kinds of logics.

In the logic gates according to the present invention, electron momentum required for obtaining the threshold voltage can be reduced compared with the background-art logic gates. Accordingly, the logic gates according to the present invention are suitable for improvement of the operating speed particularly when a large load is imposed because of long line wire, or the like. Further, the operating speed increases as the influence of parasitic capacitance of lw2103 increases. Accordingly, it is more suitable that lw2103 is arranged in proximity.

Figure 22:
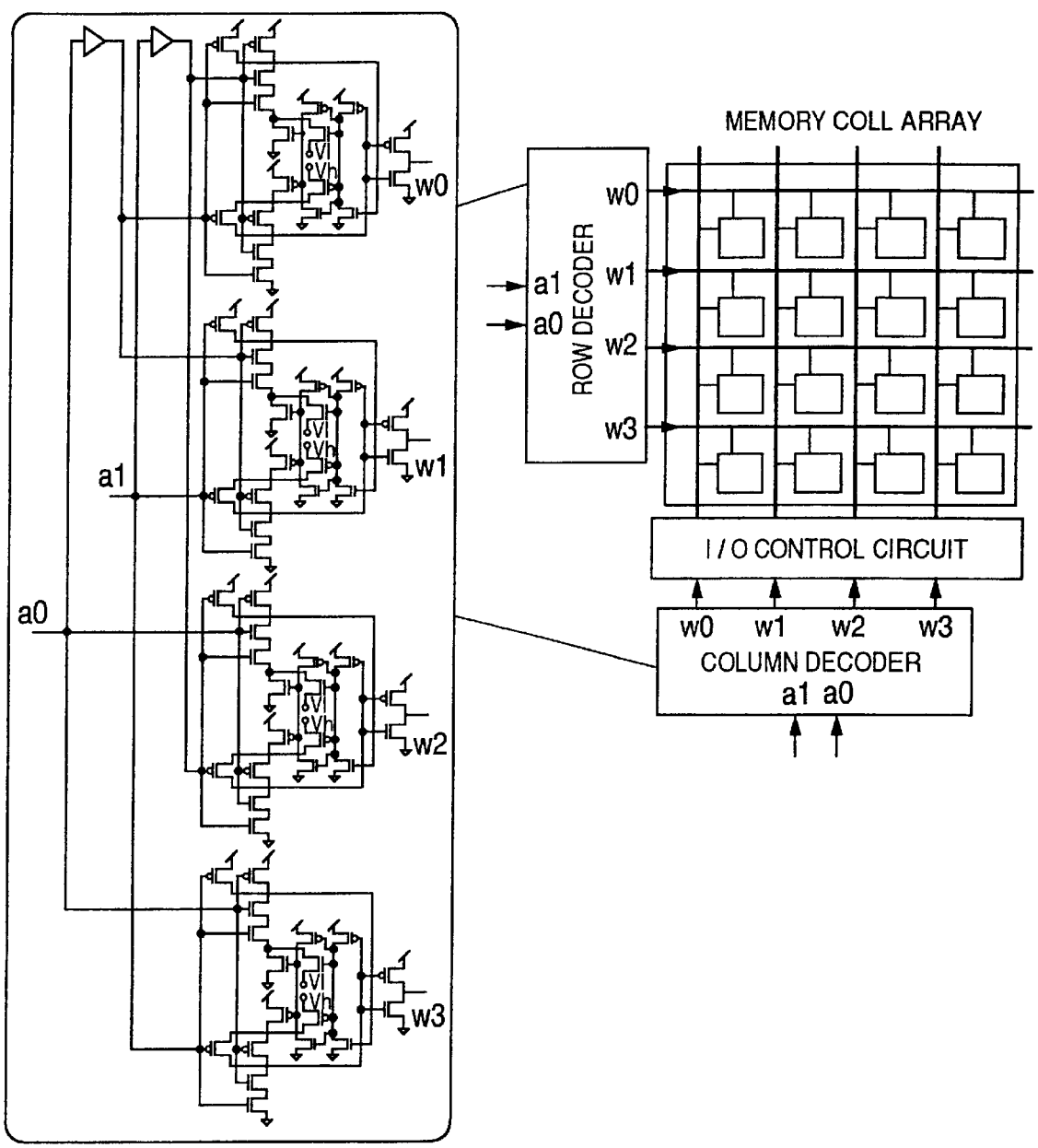
FIG. 22 is a typical diagram showing an embodiment in which a semiconductor integrated circuit according to the present invention is applied to a memory address decoder.

FIG. 22 shows the case where a semiconductor integrated circuit according to the present invention is applied to a memory address decoder. In this embodiment, logic gates according to the present invention are used in a row decoder and a column decoder.

Figure 23:
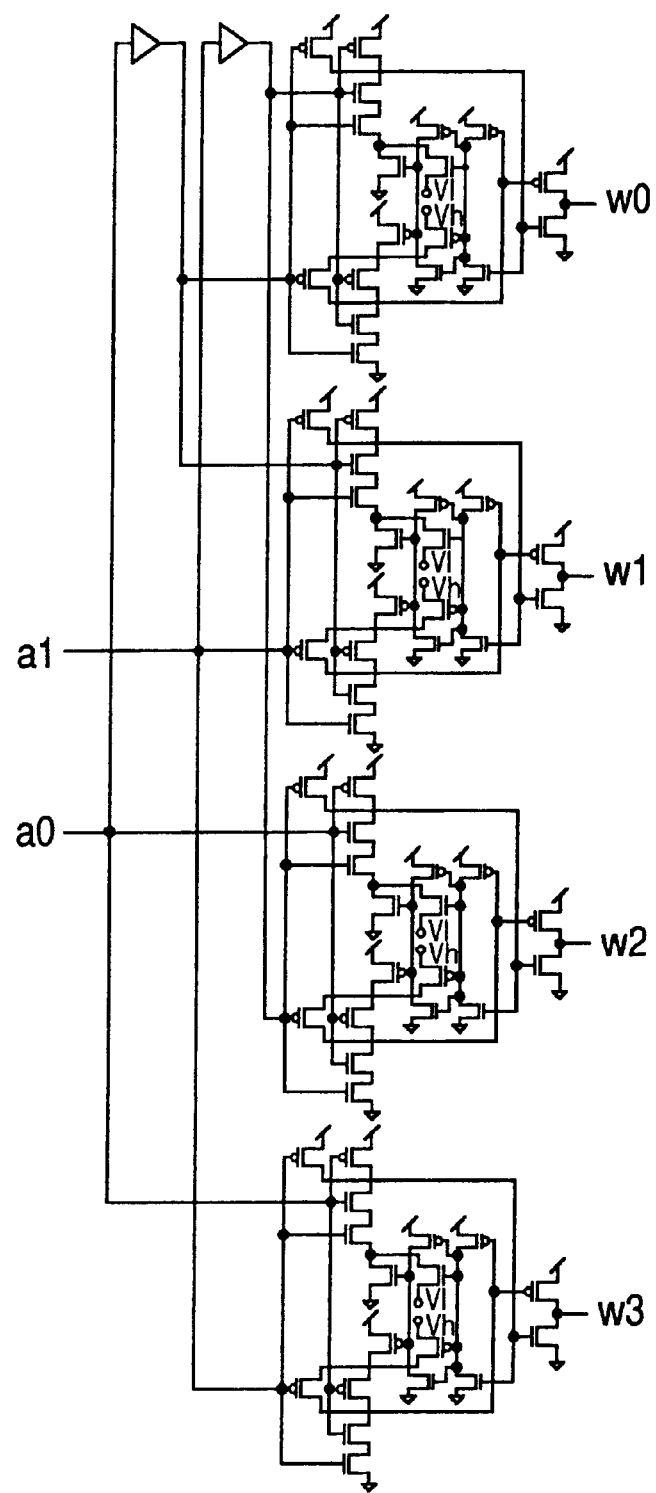
FIG. 23 is a circuit diagram showing the decoder in the embodiment depicted in FIG. 22.

FIG. 23 shows a detailed circuit diagram of FIG. 22. In FIG. 23, memory cells such as SRAM's, DRAM's, or the like, are expressed in mere rectangles for the sake of simplification. In the configuration shown in FIG. 23, a high-speed decoding operation is carried out. Accordingly, there is obtained an effect that both the speed of reading data from the memory and the speed of writing data into the memory are improved.

Figure 15:
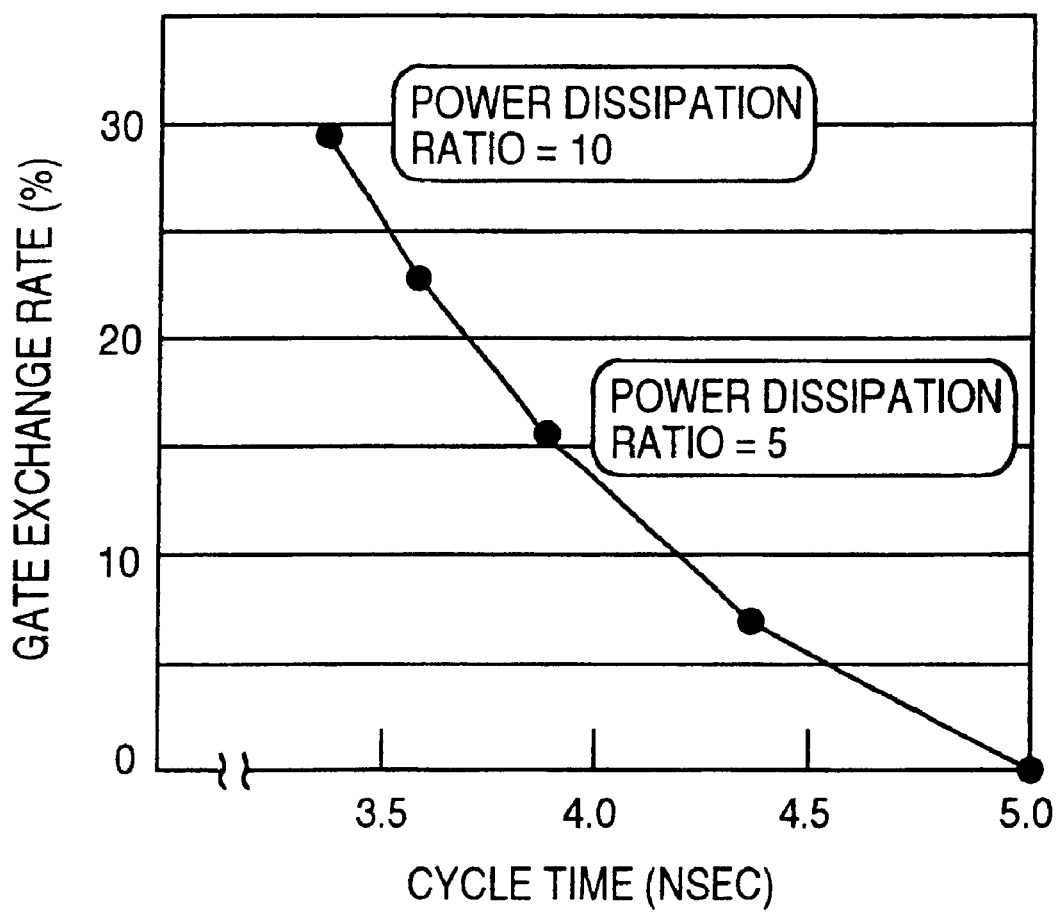
FIG. 15 is a characteristic graph showing the relation between cycle time and gate exchange rate in the embodiment shown in FIG. 14.

FIG. 15 is a graph in which the abscissa axis represents cycle time (largest path delay) in the CPU block, and the ordinate axis represents the rate (gate exchange rate) of use of logic gates constituted by circuits according to the present invention as substitute for logic gates constituted by background-art circuits.

In FIG. 15, the power dissipation ratio is a value which is normalized on the assumption that a power dissipation ratio of 1 is obtained when this block is designed by use of all logic gates constituted by background-art circuits. When all logic gates constituted by background-art circuits are used in this block, this block operates with cycle time of 5 nsec (200 MHz).

As the cycle time decreases, the required number of logic gates constituted by circuits according to the present invention increases. When, for example, this block is designed so that the cycle time is 3.9 nsec (256 MHz), the power dissipation ratio is 5 for the gate exchange rate of about 15%. When, for example, this block is designed so that the cycle time is 3.3 nsec (303 MHz), the power dissipation ratio is 10 for the gate exchange rate of about 30%. The supply voltage Vdd is 2.5, and the bias supply voltages Vh and Vl used in the logic gates according to the present invention are Vh=2.0 and Vl=0.5 respectively. As the gate exchange rate increases, the power dissipation ratio increases remarkably. Accordingly, the gate exchange rate is preferably kept to be 30% or less. To reduce power dissipation appropriately, the gate exchange rate is more preferably suppressed to be about 10%.

As described above, in accordance with the present invention, a circuit can be configured so that the operating speed is enhanced while the leakage current in the active mode is suppressed. Further, not only circuits according to the present invention and background-art circuits can be used appropriately as occasion demands but also use of circuits according to the present invention can be suppressed so as to be minimized. Accordingly, both high-speed operation and low power dissipation can be achieved simultaneously.

Further, even in the case where MOS transistors with high threshold voltage Vt are used to attain low power dissipation, a high-speed operation can be achieved.

Although the present invention is provided to achieve both a high-speed operation and a low leakage current in the active mode, the present invention can be used in combination with a commonly-known technique in which substrate bias supply voltages are controlled in the stand-by mode to raise the threshold voltage.

As described above, in accordance with the present invention, a circuit is configured so that the operating speed is enhanced while the leakage current is suppressed in the active mode. Further, not only circuits according to the present invention and background-art circuits are used appropriately as occasion demands but also use of circuits according to the present invention is suppressed to be minimized. Accordingly, there is obtained a semiconductor integrated circuit in which not only increase of power dissipation caused by the leakage current in the active mode can be suppressed but also the circuit can operate at a high speed.

What is claimed is:

1. A semiconductor integrated circuit comprising a p-channel FET, and an n-channel FET,
   a first circuit for generating a first pulse signal; and
   a second circuit for generating a second pulse signal, wherein:
      said first pulse signal is supplied to a gate of said p-channel FET;
      said second pulse signal is supplied to a gate of said n-channel FET;
      HIGH of said first pulse signal is different from HIGH of said second pulse signal;
      LOW of said first pulse signal is different from LOW of said second pulse signal;
      timing of changing said first pulse signal from HIGH to LOW is synchronized with timing of changing said second pulse signal from HIGH to LOW; and
      timing of changing said first pulse signal from LOW to HIGH is synchronized with timing of changing said second pulse signal from LOW to HIGH;
   said first circuit includes p-channel and n-channel FET's having source-drain paths connected in series; and said second circuit includes p-channel and n-channel FET's having source-drain paths connected in series;

said series connected source-drain paths of said p-channel and n-channel FET's of said first circuit are connected between a first potential and a first node;

said series connected source-drain paths of said p-channel and n-channel FET's of said second circuit are connected between a second potential and a second node;

either one of said second potential and a third potential is supplied to said first node through a first selector; and either one of said first potential or a fourth potential is supplied to said second node through a second selector.

2. A semiconductor integrated circuit according to claim 1, further comprising a first wiring for feeding said first potential, a second wiring for feeding said second potential, a third wiring for feeding said third potential, and a fourth wiring for feeding said fourth potential, wherein said first wiring, said second wiring, said third wiring and said fourth wiring are arranged in parallel with one another.

3. A semiconductor integrated circuit according to claim 2, wherein said first wiring for feeding said first potential, said second wiring for feeding said second potential, said third wiring for feeding said third potential and said fourth wiring for feeding said fourth potential are arranged in one wiring layer.

4. A semiconductor integrated circuit according to claim 2, further comprising a fifth wiring for supplying a substrate bias potential of said p-channel FET's, and a sixth wiring for supplying a substrate bias potential of said n-channel FET's, wherein said first wiring, said second wiring, said third wiring, said fourth wiring, said fifth wiring and said sixth wiring are arranged in parallel with one another.

5. A semiconductor integrated circuit according to claim 2, further comprising a fifth wiring for supplying a substrate bias potential of said p-channel FET's, and a sixth wiring for supplying a substrate bias potential of said n-channel FET's, wherein said first wiring, said second wiring, said third wiring, said fourth wiring, said fifth wiring and said sixth wiring are arranged in one wiring layer.

6. A semiconductor integrated circuit according to claim 4, wherein:

said first, second, third, fourth, fifth and sixth wirings are grouped by threes into first and second groups; and a plurality of cells each containing at least one of said first and second circuits and said p-channel and n-channel FET's are arranged between said first and second groups.

7. A semiconductor integrated circuit according to claim 1, wherein:

said semiconductor integrated circuit is parted into a logic block having a calculating function and a memory block having a memory function, said logic block including said first and second circuits, and said p-channel and n-channel FET's.

* * * * *